US008113009B2

(12) United States Patent
Kuriyama et al.

(10) Patent No.: US 8,113,009 B2
(45) Date of Patent: Feb. 14, 2012

(54) ELECTRONIC DEVICE COOLING SYSTEM AND ELECTRONIC DEVICE COOLING APPARATUS

(75) Inventors: Hiroyuki Kuriyama, Suita (JP); Kazuo Nomura, Ora-gun (JP); Kazutoyo Kagami, Ota (JP); Junichi Saito, Ashikaga (JP); Takashi Sekine, Ota (JP); Koji Nagae, Gunma (JP); Shigetaka Nishino, Ora-gun (JP)

(73) Assignee: SANYO Electric Co., Ltd., Moriguchi-shi (JP)

( * ) Notice: Subject to any disclaimer, the term of this patent is extended or adjusted under 35 U.S.C. 154(b) by 558 days.

(21) Appl. No.: 12/255,111

(22) Filed: Oct. 21, 2008

(65) Prior Publication Data

US 2009/0100848 A1    Apr. 23, 2009

(30) Foreign Application Priority Data

Oct. 22, 2007 (JP) ................... 2007-273934
Oct. 22, 2007 (JP) ................... 2007-273935
Oct. 22, 2007 (JP) ................... 2007-274028
Oct. 22, 2007 (JP) ................... 2007-274029
Oct. 22, 2007 (JP) ................... 2007-274030
Oct. 22, 2007 (JP) ................... 2007-274031

(51) Int. Cl.
*F25D 23/12* (2006.01)
*F25D 21/14* (2006.01)

(52) U.S. Cl. .......... 62/259.2; 62/285; 361/696; 454/184

(58) Field of Classification Search ................ 62/259.2, 62/272, 285; 361/694, 695, 696; 454/184
See application file for complete search history.

(56) References Cited

U.S. PATENT DOCUMENTS

| 5,467,250 | A  | * | 11/1995 | Howard et al. | ............... 361/696 |
| 6,462,944 | B1 | * | 10/2002 | Lin | ............... 361/679.5 |
| 6,775,137 | B2 | * | 8/2004 | Chu et al. | ............... 361/696 |
| 7,385,810 | B2 | * | 6/2008 | Chu et al. | ............... 361/679.48 |

(Continued)

FOREIGN PATENT DOCUMENTS

JP        04-133497 A        5/1992

(Continued)

OTHER PUBLICATIONS

Partial European Search Report dated Jul. 27, 2010, issued in corresponding European Patent Application No. 080184187.

(Continued)

*Primary Examiner* — Marc Norman
(74) *Attorney, Agent, or Firm* — Westerman, Hattori, Daniels & Adrian, LLP

(57) ABSTRACT

An electronic cooling apparatus has a cabinet which is open at the front and rear sides thereof and accommodates plural electronic devices each having a fan, and a rear door which is provided with an evaporator. Air blown by the fan is cooled by the evaporator and then returned to a room. An expansion valve and control. A drain pan with an extension portion having hole portions through which refrigerant pipes extend is provided. A drain hose discharges drain water from the drain pan. An exhaust heat temperature detecting unit and a control for controlling the refrigerant supply to the evaporator are provided. When the exhaust heat temperature is equal to or less than a set exhaust temperature, the controller stops the refrigerant supply to the evaporator. When the exhaust heat temperature exceeds the set temperature, the controller starts the refrigerant supply.

13 Claims, 15 Drawing Sheets

U.S. PATENT DOCUMENTS

| | | | |
|---|---|---|---|
| 7,679,909 B2 * | 3/2010 | Spearing et al. ............... | 361/699 |
| 7,963,118 B2 * | 6/2011 | Porter et al. ................. | 62/259.2 |
| 2006/0232945 A1 | 10/2006 | Chu et al. | |
| 2008/0068798 A1 * | 3/2008 | Hendrix et al. ............... | 361/696 |

FOREIGN PATENT DOCUMENTS

| | | |
|---|---|---|
| JP | 8-316676 | 11/1996 |
| JP | 09-133446 A | 5/1997 |
| JP | 09-159285 A | 6/1997 |
| JP | 09-236298 A | 9/1997 |
| JP | 2002-373033 A | 12/2002 |
| JP | 2003-289195 A | 10/2003 |
| JP | 2005-140464 A | 6/2005 |
| JP | 2005-228216 A | 8/2005 |
| JP | 2006-163663 A | 6/2006 |
| JP | 2009-081439 A | 4/2009 |
| WO | 2006/032888 A1 | 3/2006 |

OTHER PUBLICATIONS

Schmidt, R. et al.; "Maintaining datacom rack inlet air temperatures with water cooled heat exchanger"; Advances in Electronic Packaging 2005, Proceedings of the ASME/Pacific Rim International Conference and Exhibition on Integration and Packaging of MEMES, NEMS and Electronic Systems; Presented at . . . , Jul. 17-22, 2005, San Francisco, California, Part A, Jan. 1, 2005, pp. 663-674.

Japanese Office Action dated Oct. 11, 2011, issued in corresponding Japanese Patent Application No. 2007-273935.

Japanese Office Action dated Nov. 1, 2011, issued in corresponding Japanese Patent Aplication No. 2007-273934.

Japanese Office Action dated Nov. 1, 2011, issued in corresponding Japanese Patent Application No. 2007-274028.

Japanese Office Action dated Nov. 1, 2011, issued in corresponding Japanese Patent Application No. 2007-274029.

Japanese Office Action dated Nov. 1, 2011, issued in corresponding Japanese Patent Application No. 2007-274030.

* cited by examiner

ELECTRONIC DEVICE COOLING SYSTEM AND ELECTRONIC DEVICE COOLING APPARATUS

INCORPORATION BY REFERENCE

The present application claims priority under 35 U.S.C. §119 to Japanese Patent Application No. 2007-274028 filed on Oct. 22, 2007, Japanese Patent Application No. 2007-274029 filed on Oct. 22, 2007, Japanese Patent Application No. 2007-274030 filed on Oct. 22, 2007, Japanese Patent Application No. 2007-274031 filed on Oct. 22, 2007, Japanese Patent Application No. 2007-273934 filed on Oct. 22, 2007, and Japanese Patent Application No. 2007-273935 filed on Oct. 22, 2007. The content of the applications is incorporated herein by reference in its entirety.

BACKGROUND OF THE INVENTION

1. Field of the Invention

The present invention relates to an electronic device cooling system and an electronic device cooling apparatus for cooling air which is blown out by a fan provided to an electronic device mounted in a cabinet.

2. Description of Related Art

There have been generally known an electronic device cooling system (for example, see U.S. Patent No. 2006/232945) and an electronic cooling apparatus (for example, see JP-A-8-316676) in which an air-water heat exchanger is disposed at an air outlet port side of a cabinet in which an electronic device is mounted and air blown by a fan provided to the electronic device mounted in the cabinet is cooled by the air-water heat exchanger and then returned to a room.

This type of electronic device cooling system is disposed in a computer room, and cools a serve and a network device disposed in the computer room. Furthermore, with respect to this type of electronic device cooling apparatus, an apparatus provided with a heater or a moisture adsorbent/discharge material for performing humidity control of the inside of a cabinet has been proposed.

An electronic device is weak to water and thus it is desired that water is not brought into a computer room. However, in the related arts, the air-water heat exchanger is disposed in the neighborhood of the electronic device, and thus when water leakage occurs from even a part of a water circulating passage through which chiller water is circulated to the air-water heat exchanger, the electronic device may be broken by this water.

It is general that the inside of a computer room is managed to be kept at a fixed humidity and a fixed temperature, and also it is necessary to prevent dew condensation because electronic devices are weak to water as described above. However, in the related arts, the electronic equipment apparatus is provided with the heater or the moisture adsorbent/discharge material for performing humidity control, and thus the number of parts is increased. In addition, the related arts use cooling water in the neighborhood of the electronic device, and thus it is necessary to take a strict counter measure to water leakage.

Furthermore, when a plurality of electronic devices as described above are mounted in a stack style and cooled in a cabinet, the temperature of air (thermal load) which is blown from these electronic devices to the air-water heat exchanger by the fans provided to the electronic devices is different in accordance with the actuation state of each of the electronic devices. Therefore, it is desired to apply weighting to cooling power in accordance with a cooling site, for example, an area having a larger thermal load is more strongly cooled while an area having a smaller thermal load is more weakly cooled, whereby the stacked electronic devices are effectively cooled.

However, according to the related arts, chiller water which is cooled to a fixed temperature is uniformly circulated over the whole area of the air-water heat exchanger at all times irrespective of the magnitude of the thermal load, and thus it has been impossible to effectively cool the stacked electronic devices. Furthermore, chiller water which is cooled to a fixed temperature is circulated to the air-water heat exchanger, and thus energy consumption is increased.

SUMMARY OF THE INVENTION

Therefore, an object of the present invention is to provide an electronic device cooling system that can effectively a cool electronic device without using water.

Another object of the present invention is to provide an electronic device cooling system that can effectively cool electronic devices stacked and mounted in a cabinet and also reduce energy consumption for cooling.

A further object of the present invention is to provide an electronic cooling system in which a rear door can be smoothly opened/closed even when an evaporator is provided to the rear door.

A further object of the present invention is to provide an electronic device cooling system in which dew condensation occurring in an evaporator provided to a rear door can be prevented from affecting an electronic device.

A further object of the preset invention is to provide an electronic cooling apparatus that can facilitate expansion (addition) of devices constituting the electronic device cooling apparatus.

A further object of the present invention is to provide an electronic device cooling apparatus that can prevent dew condensation with a simple construction.

In order to attain the above object, according to an aspect of the present invention, there is provided an electronic device cooling system comprising: at least one cabinet that is opened at the front and rear sides thereof and in which a plurality of electronic devices each having a fan are mounted; and a rear door disposed at a rear opening side of the cabinet so that air can flow through the rear door; and an evaporator that constitutes a refrigeration cycle and is provided to the rear door, wherein air blown by the fan is cooled by the evaporator of the rear door and returned to a room.

According to the electronic device cooling system, refrigerant circulating through the refrigeration cycle is supplied to the evaporator disposed at the rear door, and thus even if refrigerant leaks from a refrigerant circulating passage, the refrigerant does not cause damages such as short-circuiting and ground leakage to the electronic devices.

In the above electronic device cooling system, an expansion valve constituting the refrigerant cycle and an electronic component box for controlling the expansion valve may be provided to the rear door integrally with the evaporator.

In this construction, the evaporator, the expansion valve and the electronic component box are integrally mounted to the rear door. Therefore, the evaporator, the expansion valve and the electronic component box can be handled as one unit, and by connecting this unit to heat source equipment (such as a compressor or the like) constituting the refrigeration cycle, heat emitted from the electronic devices can be simply cooled. Furthermore, the air blown by the fan(s) is cooled by the evaporator of the rear door and then returned to the room, so that the room temperature can be prevented from being excessively increased by the heat emitted from the electronic devices and also occurrence of a temperature distribution (unevenness of temperature) in the room can be prevented.

In this construction, the evaporator may be disposed substantially over the whole area of the rear door, a refrigerant pipe connected to the evaporator and the expansion valve may be collectively disposed at a hinge side of the rear door, and the electronic component box may be disposed in a lower area of the rear door. Furthermore, a caster may be provided to the bottom portion of the cabinet so that the cabinet is freely movable.

According to the above electronic device cooling system, the electronic devices can be effectively cooled without using water.

Furthermore, according to an aspect of the present invention, there is provided an electronic device cooling system comprising: at least one cabinet that is opened at the front and rear sides thereof and in which a plurality of electronic devices each having a fan are mounted while stacked; and a rear door disposed at a rear opening side of the cabinet so that air can flow through the rear door; and an evaporator constituting a refrigeration cycle, the evaporator being provided to the rear door and divided into plural evaporating portions so that refrigerant can selectively flow through each of the evaporating portions, wherein air blown by the fan is cooled by the evaporator of the rear door and returned to a room.

According to this construction, the amount of refrigerant flowing through an evaporating portion corresponding to an area having a large thermal load can be set to a large value while the amount of refrigerant flowing through an evaporating portion corresponding to an area having a small thermal load is set to a small value, whereby the electronic devices which are stacked and mounted in the cabinet can be effectively cooled. Furthermore, by making the refrigerant selectively flow through each evaporating portion, for example, the amount of the refrigerant flowing through the evaporating portion corresponding to an area having a small thermal load can be set to a small value. Therefore, the overall refrigerant circulation amount of the evaporator can be reduced, and thus the energy consumption can be also reduced.

In this construction, the evaporator may be disposed substantially over the whole area of the rear door, a refrigerant pipe connected to each evaporating portion of the evaporator and expansion valves provided to the plural evaporating portions may be collectively disposed at a hinge side of the rear door, and an electronic component box for controlling the expansion valves may be disposed in a lower area of the rear door.

Furthermore, in the above construction, the evaporating portion may be divided into two parts in the vertical direction. The evaporating portion may be divided into the two parts with a shelf portion provided to the cabinet in advance as a boundary therebetween. Each of the two parts into which the evaporating portion is divided with respect to the shelf portion may be further divided into plural parts.

In the electronic device cooling apparatus of the first embodiment, a liquid pipe having a smaller diameter and a gas pipe having a larger diameter which are connected to the evaporator may be collectively disposed at a hinge side of the rear door so that the gas pipe is nearer to the hinge side than the liquid pipe.

According to this construction, the evaporator constituting the refrigerant cycle is provided to the rear door, and the liquid pipe having a smaller diameter and the gas pipe having a larger diameter which are connected to the evaporator are collectively disposed at the hinge side of the rear door so that the gas pipe is nearer to the hinge side than the liquid pipe. Therefore, when the rear door is opened/closed, the sagging amount of the gas pipe having the larger diameter can be suppressed to a small value, and thus the rear door can be smoothly opened/closed.

In the above construction, the liquid pipe and the gas pipe may be a flexible liquid pipe and a flexible gas pipe which are connected to a main liquid pipe and a main gas pipe extending from heat source equipment having a compressor and a condenser, respectively.

Furthermore, in the above construction, the cabinet is disposed on a double flooring having a lower floor and an upper floor which has an opening therein and disposed above a lower floor so that a space is provided between the upper and lower floors, the main liquid pipe and the main gas pipe are disposed in the space, and the flexile liquid pipe and the flexible gas pipe which are connected to the main liquid pipe and the main gas pipe respectively are connected through the opening of the upper floor to the evaporator disposed in the rear door of the cabinet.

In the electronic device cooling apparatus of the first aspect, refrigerant pipes connected to the evaporator are collectively disposed at a hinge side, a drain pan for receiving drain water dropped from the evaporator is provided below the evaporator, the drain pan is provided with an extension portion extending to the hinge side of the rear door and the extension portion is provided with a hole portion through which the refrigerant pipes penetrate and a drain hose connection port to which a drain hose for discharging drain water stocked in the drain pan to the outside of the apparatus is connected.

According to this construction, the drain pan for receiving drain water dropped from the evaporator is provide below the evaporator disposed in the rear door, and thus the drain water (dew condensation water) is prevented from affecting the electronic devices in the cabinet. Furthermore, the drain pan has the extension portion extending to the hinge side of the rear door, and the extension portion is provided with the hole portion through which the refrigerant pipes penetrate and the drain hose connection port to which the drain hose for discharging drain water stocked in the drain pan to the outside of the apparatus is connected. Therefore, the evaporator, the refrigerant pipes, the drain pan and the drain hose can be well collectively disposed.

Furthermore, in the above construction, the drain pan may be provided with a cut-out portion which is formed by cutting out a part of the upper edge of the extension portions so that the cut-out portion is lower than the other portion of the upper edge.

In this construction, the evaporator may be disposed substantially over the whole area of the rear door, the refrigerant pipes and the expansion valve which are connected to the evaporator may be collectively disposed at the hinge side of the rear door, and the electrical component box may be disposed in a lower area of the rear door. Furthermore, a caster may be provided to the bottom portion of the cabinet so that the cabinet is freely movable.

According to the above construction, the drain pan for receiving drain water dropped from the evaporator is provided below the evaporator disposed in the rear door, and thus the drain water (dew condensation water) can be prevented from affecting the electronic devices mounted in the cabinet.

According to an aspect of the present invention, there is provided an electronic device cooling apparatus comprising: heat source equipment having a compressor and a condenser; and a plurality of evaporators that are connected to a main liquid pipe and a main gas pipe extending from the heat source equipment in parallel through a flexile liquid pipe and a flexible gas pipe in parallel, each evaporator being disposed on a rear door for closing an opening of each of cabinets in which electronic devices each having a fan are mounted, and the heat source equipment and the evaporators constituting a refrigeration cycle, wherein air blown by the fan provided to each of the electronic devices is cooled by each evaporator of the rear door and returned to a room, and the main liquid pipe and the main gas pipe are formed to be larger in diameter in advance so that heat source equipment or an evaporator can be further added, and provided with connection ports for the addition of the heat source equipment or the evaporator at predetermined positions thereof.

In the above construction, the main liquid pipe and the main gas pipe may be designed to be large in diameter (thick) in advance so that heat source equipment or an evaporator(s) disposed in the rear door can be newly added.

According to the above electronic device cooling apparatus, the main liquid pipe and the main gas pipe are formed to be larger in diameter so that heat source equipment or an evaporator disposed on a rear door can be added, and the connection ports for the addition of the heat source equipment or the evaporator are provided at the predetermined positions thereof. Therefore, the heat source equipment or the evaporator can be easily added.

In the above construction, the cabinet is disposed on a double flooring having a lower floor and an upper floor which has an opening therein and disposed above a lower floor so that a space is provided between the upper and lower floors, the main liquid pipe and the main gas pipe are disposed in the space, and the flexile liquid pipe and the flexible gas pipe which are connected to the connection ports provided to the main liquid pipe and the main gas pipe respectively are connected through the opening of the upper floor to the evaporator disposed in the rear door of the cabinet.

In the above construction, the main liquid pipe and the main gas pipe may be provided with the connection ports so that the connection ports are spaced from one another in the extension direction of each of the connection pipes. Furthermore, in the above construction, a branch unit for branching the main liquid pipe and the main gas pipe may be provided in the space between the lower floor and the upper floor, and the connection ports may be provided to the branch unit.

Furthermore, according to a third aspect of the present invention, there is provided an electronic device cooling apparatus comprising: heat source equipment having a compressor and a condenser; an evaporator that is connected to a refrigerant pipe extending from the heat source equipment and disposed on a rear door so as to close an opening of a cabinet in which an electronic device having a fan is mounted, the heat source equipment and the evaporator constituting a refrigeration cycle, the cabinet being disposed in a computer room, and air blown by the fan provided to the electronic device being cooled by the evaporator of the rear door and returned to a computer room; an exhaust heat temperature detecting unit for detecting exhaust heat temperature of the electronic device; and a controller for stopping refrigerant supply to the evaporator when the exhaust heat temperature is not more than a set exhaust set temperature which is defined in the computer room so that no dew condensation occurs in the evaporator, and starts refrigerant supply to the evaporator when the exhaust heat temperature exceeds the set exhaust heat temperature.

According to the above-described electronic device cooling apparatus, when the exhaust heat temperature of the electronic device is not more than the set exhaust temperature which is defined in the computer room so that no dew condensation occurs in the evaporator, the refrigerant supply to the evaporator is stopped. When the exhaust heat temperature exceeds the set exhaust heat temperature, the refrigerant supply to the evaporator is started. Therefore, it is unnecessary to provide a heater or a moisture adsorbent/discharge material to control humidity, and dew condensation of the evaporator can be prevented with a simple construction.

The above electronic device cooling apparatus may be further provided with a refrigerant temperature detecting unit for detecting the temperature of refrigerant passing through the evaporator, and an operation controller for controlling the operation of the compressor so that the refrigerant temperature is not lower than a set refrigerant temperature which is defined in the computer room so that no dew condensation occurs in the evaporator.

Furthermore, in the above construction, it is preferable that the evaporator comprises plural evaporating portions so that refrigerant can be made to selectively flow through each evaporating portion, an expansion valve is provided to a refrigerant pipe connected to each evaporating portion, the exhaust heat temperature detecting unit detects the exhaust heat temperature of the electronic device at the upstream side of each evaporator, the controller judges every exhaust heat temperature whether the exhaust heat temperature is not more than the set exhaust heat temperature which is defined in the computer so that no dew condensation occurs in the evaporator, and stops refrigerant supply to an evaporator disposed at a downstream side of an electronic device whose exhaust heat temperature is not more than the set exhaust heat temperature or stops refrigerant supply to the evaporator when the exhaust heat temperature exceeds the set exhaust heat temperature.

Furthermore, according to an aspect of the present invention, there is provided an electronic device cooling apparatus comprising: heat source equipment having a compressor and a condenser; an evaporator that is connected to a refrigerant pipe extending from the heat source equipment and disposed on a rear door so as to close an opening of a cabinet in which an electronic device having a fan is mounted, the heat source equipment and the evaporator constituting a refrigeration cycle, the cabinet being disposed in a computer room, and air blown by the fan provided to the electronic device being cooled by the evaporator of the rear door and returned to a computer room; a refrigerant temperature detecting unit for detecting temperature of refrigerant passing through the evaporator; and an operation controller for controlling the operation of the compressor so that the refrigerant temperature is not lower than a set refrigerant temperature which is defined in the computer room so that no dew condensation occurs in the evaporator.

According to the above electronic device cooling apparatus, the operation of the compressor is controlled so that the temperature of the refrigerant passing through the evaporator is not lower than a set refrigerant temperature which is defined in the computer room so that no dew condensation occurs in the evaporator, and thus it is unnecessary to provide a heater or an absorbent/discharge material for performing humidity control, so that the dew condensation of the evaporator can be prevented with a simple construction.

In the above construction, it is preferable that (23) the refrigerant temperature detecting unit detects refrigerant temperature at an inlet port of the evaporator and refrigerant temperature at an outlet port of the evaporator, and the operation controller controls the operation of the compressor so that the minimum value of the refrigerant temperature at the inlet port and the refrigerant temperature at the outlet port is not lower than the set refrigerant temperature.

Furthermore, in the above construction, it is preferable that the evaporator comprises plural evaporating portions so that refrigerant can be made to selectively flow through each of the evaporating portions, an expansion valve is provided to a refrigerant pipe connected to each of the evaporating portions, the refrigerant temperature detecting unit detects refrigerant temperature at each of inlet and outlet ports of each evaporating portion, and the operation controller controls the operation of the compressor so that the minimum value of the refrigerant temperature at the inlet port and the refrigerant temperature at the outlet port in each evaporating portion is not lower than the set refrigerant temperature.

According to the above electronic device cooling apparatus, when the exhaust heat temperature of the electronic device is not more than the set exhaust temperature which is defined in the computer room so that no dew condensation occurs in the evaporator, the refrigerant supply to the evaporator is stopped, and when the exhaust heat temperature exceeds the set exhaust heat temperature, the refrigerant supply to the evaporator is started. Therefore, the dew condensation of the evaporator can be prevented with a simple construction.

DETAILED DESCRIPTION OF THE PREFERRED EMBODIMENTS

Preferred embodiments according to the present invention will be described hereunder with reference to the accompanying drawings.

Figure 1:
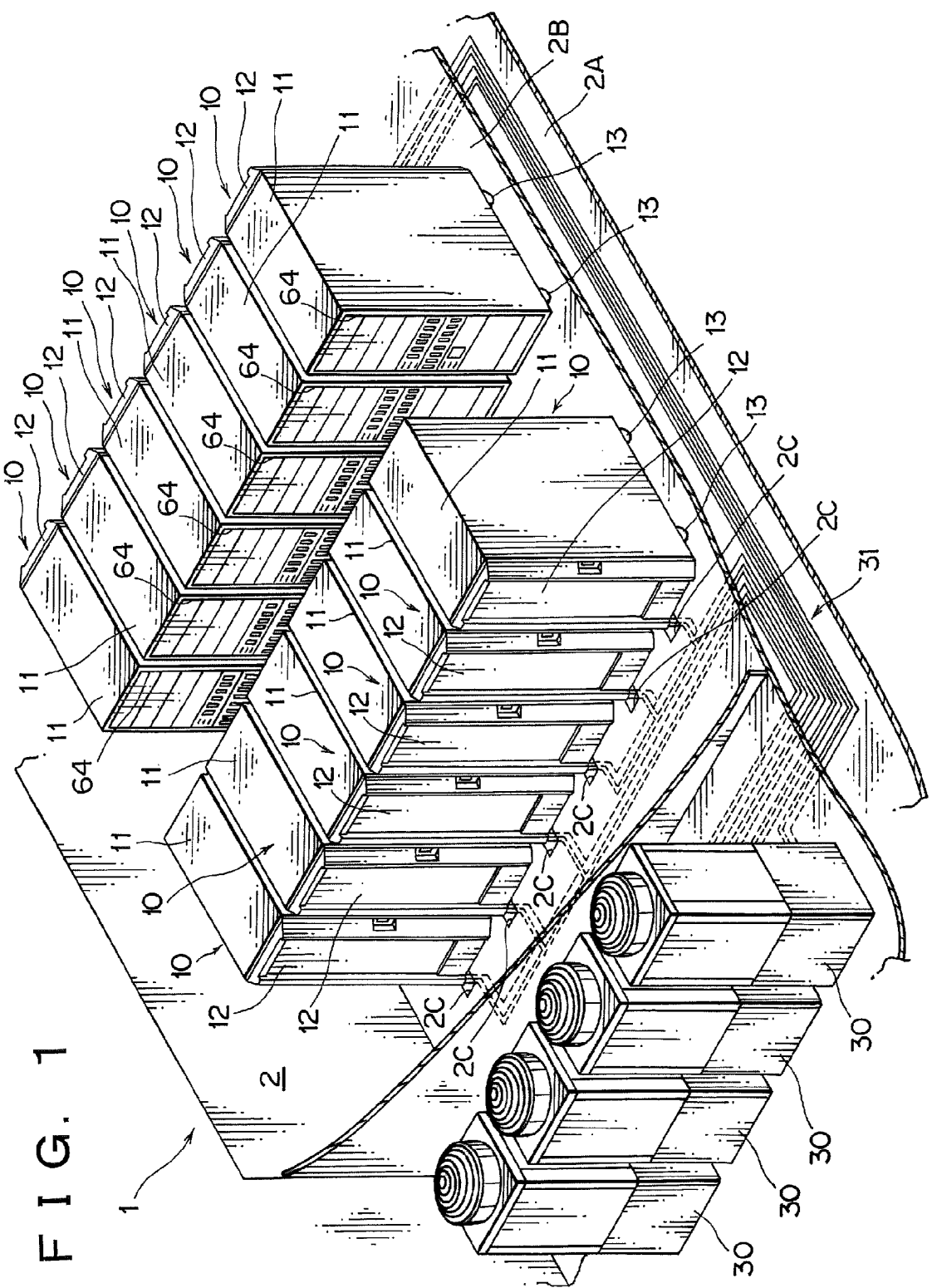
FIG. 1 is a diagram showing an electronic device cooling system according to a first embodiment of the present invention.

FIG. 1 is a diagram showing an electronic device cooling system according to a first embodiment of the present invention.

The electronic device cooling system 1 is a system for cooling a plurality of electronic devices 3 (see FIG. 2) disposed in a computer room 2. The computer room 2 is constructed as a double flooring, and server racks 10 are mounted on the double flooring.

Figure 2:
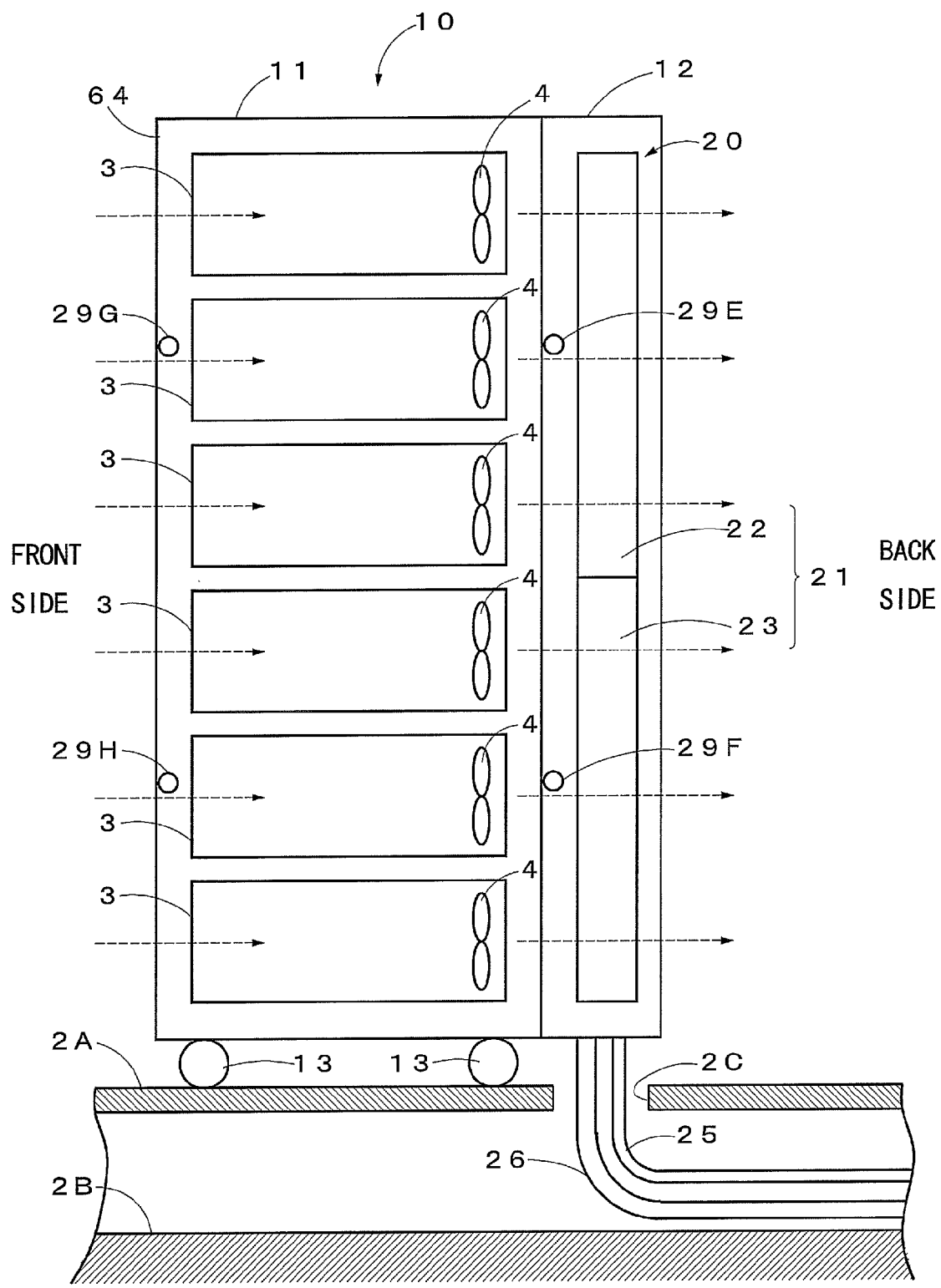
FIG. 2 is a diagram showing a server rack.

FIG. 2 is a diagram showing a server rack 10. The server rack 10 has a cabinet 11, and the plural electronic devices 3 are disposed and stacked in the vertical direction in the cabinet 11 so that the back surfaces thereof are directed to the back side of the cabinet 11. Furthermore, a single swing rear door 12 is provided to the rear side of the cabinet 11 so as to freely cover an opening 65 of the rear side of the cabinet 11, and the rear door 12 is constructed so that air can freely pass therethrough (i.e., air can be freely ventilated), and an electronic device cooling unit 20 is disposed in the rear door 12. Furthermore, casters 13 are provided to the bottom of the server rack 10 so that the server rack 10 can be easily moved.

The electronic device 3 is a server or network equipment, and this type of electronic device is generally provided with a fan 4 for cooling the electronic device itself. The electronic device having the fan 4 has a forced air cooling function of driving the fan 4 to introduce air into the device and discharging the air from the back side of the device when the temperature in the device exceeds a predetermined temperature. Accordingly, by disposing each electronic device 3 so that the back side of the electronic device 3 faces the back surface of the cabinet 11, indoor air is sucked from an opening of the front side of the cabinet by the fans 4 attached to the electronic devices 3 as indicated by broken-line arrows (representing the flow of cooling air in FIG. 2) to cool the electronic devices 3, and then the cooling air is passed through the rear door 12 and returned into the room. By opening the rear door 12, it is made easy to access the electronic devices 3 in the cabinet 11.

The electronic device cooling unit 20 is constructed integrally with the rear door 12 of the server rack 10, and the electronic device cooling units 20 provided to the plural (three in this embodiment) are connected to a main refrigerant pipe 31 (see FIG. 1) extending from one heat source equipment 30 (see FIG. 1) in parallel. That is, an electronic device cooling apparatus 40 is constructed by plural (three) electronic device cooling units 20 and the heat source equipment 30 to which these electronic device cooling units are connected through the pipes. In the example shown in FIG. 1, the electronic device cooling units 20 in the three server racks 10 are respectively connected to one heat source equipment 30 to construct one system of electronic device cooling device 40, and further twelve server racks 10 are disposed in the computer room 12, whereby four systems of electronic device cooling apparatuses 40 are disposed in the computer room 12.

The electronic device cooling unit 20 is a unit which is pipe-connected to the heat source equipment 30 to thereby constitute a refrigeration circuit for performing refrigeration cycle. As shown in FIG. 2, the electronic device cooling unit 20 has an evaporator 21, and when air discharged from the electronic device 3 flows through the evaporator 21 in the rear door 12, the air is cooled by the evaporator 21 and then returned to the room. This evaporator 21 may extend substantially in the vertical direction (and may further extent substantially over the whole area of the rear door 12), and may be divided into upper evaporating portion 22 and lower evaporating portion 22 while substantially the intermediate portion thereof in the vertical direction is set as a boundary. The upper evaporating portion 22 serves to cool the electronic devices 3 at the upper half side of the cabinet 11, and the lower evaporating portion 22 serves to cool the electronic devices 3 at the lower half side of the cabinet 11.

In this construction, refrigerant circulating through the refrigeration cycle is supplied to the evaporator 21 of the electronic device cooling unit 20. Therefore, even when refrigerant leaks from a refrigerant circulating passage, this refrigerant immediately evaporates, and thus the electronic devices 3 can be prevented from being damaged due to short-circuiting or ground leakage.

Figure 3:
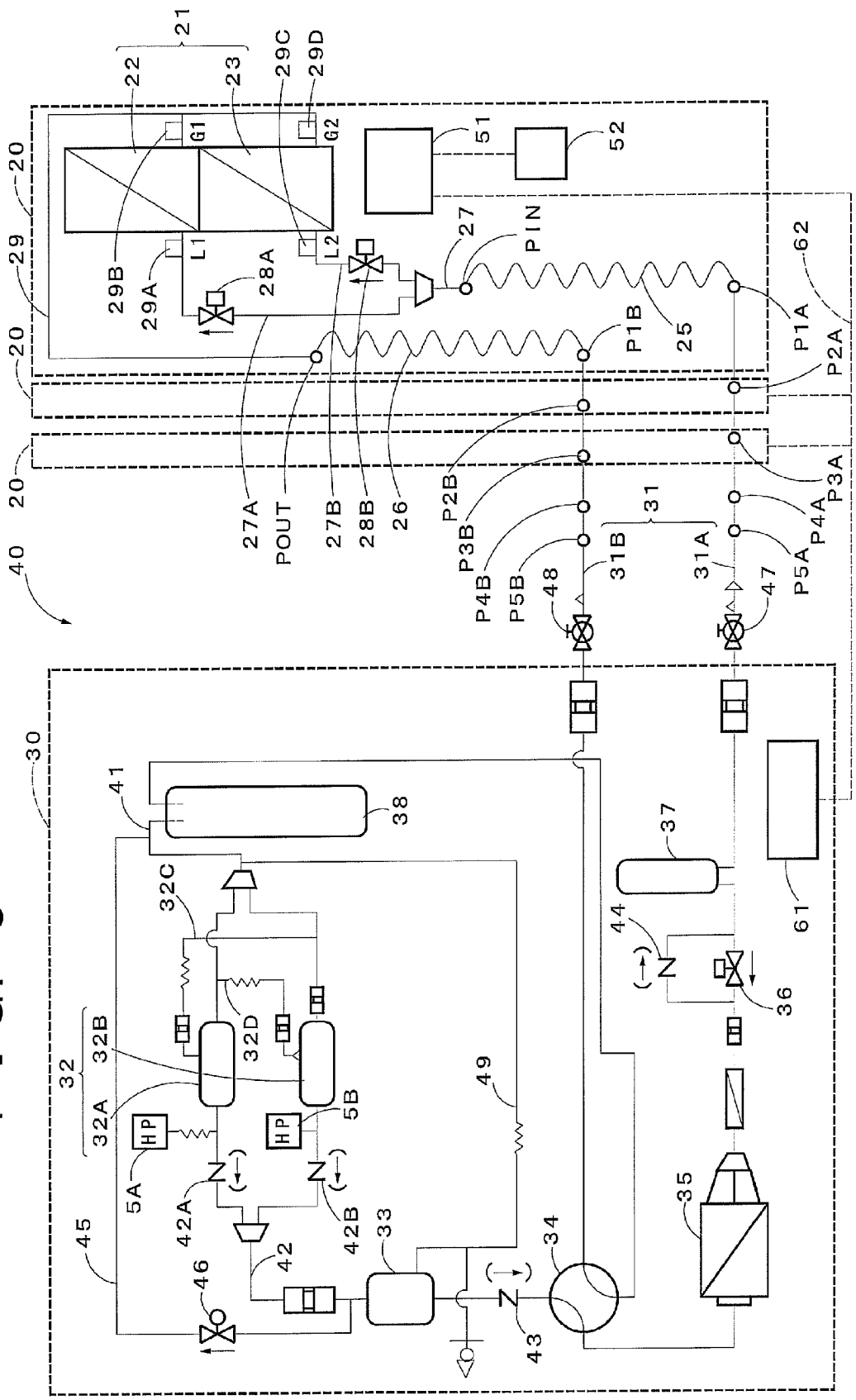
FIG. 3 is a diagram showing a circuit construction of an electronic device cooling apparatus.

FIG. 3 is a diagram showing the circuit construction of the electronic device cooling apparatus 40. As shown in FIG. 3, the electronic device cooling units 20 are connected to a main liquid pipe 31A and a main gas pipe 31B constituting the main refrigerant pipe 31 extending from the heat source equipment 30 through flexible liquid pipes (liquid pipes) 25 and flexile gas pipes (gas pipes) 26 in parallel. A flexible tube having flexibility and refrigerant impermeability is applied as the flexile liquid pipe 25 and the flexible gas pipe 26, a relatively small-diameter tube is applied as the flexible liquid pipe 25, and a relatively large-diameter tube is applied as the flexible gas pipe 26.

One ends of the flexible liquid pipe 25 and the flexible gas pipe 26 are connected to the main liquid pipe 31A and the main gas pipe 31B extending from the heat source equipment 30. The other end of the flexible liquid pipe 25 is connected to a liquid pipe connection portion PIN of the electronic device cooling unit 20. The refrigerant pipe (liquid pipe) 27 extending from the liquid pipe connection portion PIN is branched to two liquid branch pipes 27A and 27B. One liquid branch pipe 27A is connected to the inlet port of the upper evaporating portion through an expansion valve 28A, and the other liquid branch pipe 27B is connected to the inlet port of the lower evaporating portion 22 through an expansion valve 28B.

The outlet ports of the evaporating portions 22, 23 are pipe-connected to one joint refrigerant pipe (gas pipe) 29, and the flexible gas pipe 26 is connected to a gas pipe connection portion POUT provided to the end portion of the joint refrigerant pipe 29. Accordingly, the refrigerant pipe is connected to the evaporator 21 so that refrigerant can be made to selectively flow through each of the evaporating portions 22, 23 in the electronic device cooling unit 20.

As described above, the evaporator 21 of the electronic device cooling unit 20 is connected through the flexible liquid pipe 25 and the flexible gas pipe 26, and thus the flexible pipes and 26 can be prevented from sagging and disturbing opening/closing of the rear door 12 containing the evaporator when the rear door 12 is opened/closed. Furthermore, the position of the server rack 10 can be finely adjusted even while these pipes are connected.

Here, as shown in FIG. 1, the main liquid pipe 31 and the main gas pipe 31B are routed in the underfloor space between the upper floor 2A and the lower floor 2B of the computer room 2, and the flexile liquid pipe 25 and the flexible gas pipe 26 connected to the main liquid pipe 31A and the main gas pipe 31B are passed through an opening hole 2C (see FIG. 2) formed in the upper floor 2A and connected to the evaporator 21 in the rear door 12. Therefore, as shown in FIG. 2, the flexible liquid pipe 25 and the flexible gas pipe 26 are routed so as to extend from the evaporator 21 downwardly and be gently bent in the underfloor space. The flexible pipes 25 and 26 are designed to be extra long, whereby only the flexible pipes 25, 26 are moved in conformity with the movement of the rear door 12 when the rear door 12 is opened/closed. Accordingly, no force acts on the other pipes when the rear door 12 is opened/closed, and thus steel pipes may be used as the other pipes, for example, the main liquid pipe 31A and the main gas pipe 31B.

In the electronic device cooling unit 20, an electrical component unit (electrical component box) 51 and a remote controller 52 connected to the electrical component unit 51 are provided at the lower side of the evaporator 21. The electrical component unit 51 has a function of detecting an inlet port refrigerant temperature L1 and an outlet port refrigerant temperature G1 of the upper evaporating portion and also an inlet port refrigerant temperature L2 and an outlet port refrigerant temperature G2 of the lower evaporating portion 23 by four temperature sensors (refrigerant temperature detecting units) 29A to 29D, controlling each of the expansion valves 28A and 28B on the basis of the temperature difference between the inlet port and the outlet port of each of the evaporating portions 22, 23 (L1-G1, L2-G2) so as to obtain a proper degree of superheat, and also communicating with the heat source equipment 30.

Furthermore, as shown in FIG. 2, the electronic device cooling unit 20 is further provided with exhaust heat temperature sensors (exhaust heat temperature detecting units) 29E and 29F which are disposed at the upstream side of the upper evaporating portion 22 and the lower evaporating portion 23 respectively and detect the temperatures (exhaust heat temperatures) TX1, TX2 of air discharged from the electronic devices 3 mounted at the upper and lower sides, and the outputs of the sensors 29E and 29F are input to the electrical component unit 51.

In this construction, the electrical component unit 51 controls the opening degree of each of the expansion valves 28A, 28B so that refrigerant can be made to selectively flow through each of the upper evaporating portion 22 and the lower evaporating portion 23. Therefore, for example, when the electronic devices 3 are stacked at the lower side from the center portion of the cabinet 11, the electrical component unit 51 makes the refrigerant flow through the lower evaporating portion 23 corresponding to the lower side of the cabinet 11 at which the electronic devices 3 are mounted, and also closes the expansion valve 28A so that no refrigerant flows through the upper evaporating portion 22. Accordingly, the upper space of the cabinet 11 in which no electronic device 3 is mounted can be prevented from being needlessly cooled, and thus the energy consumption can be reduced.

Furthermore, when the temperature of air blown from the fans 4 of the electronic devices 3 disposed at the upper side of the cabinet 11 (i.e., the exhaust heat temperature) is high and the exhaust heat temperature of air discharged from the electronic devices 3 disposed at the lower side of the cabinet 11 is low, the outlet port refrigerant temperature G1 of the upper evaporating portion 22 is higher than the outlet port refrigerant temperature G2 of the lower evaporating portion 23. Therefore, the electronic component unit 51 controls the expansion valves 28A and 28B so that the opening degree of the expansion valve 28A is larger than that of the expansion valve 28B, whereby the temperature difference between the inlet and outlet ports of each of the evaporating portions 22, 23 is adjusted to a proper degree of superheat. Accordingly, an area A (FIG. 2) having a large thermal load which corresponds to the upper evaporating portion 22 can be more concentratively cooled as compared with an area B (FIG. 2) having a small thermal load which corresponds to the lower evaporating portion 23. Therefore, the electronic devices 3 stacked in the cabinet 11 can be effectively cooled.

The remote controller 52 is disposed on the side surface or back surface of the server rack 10 of the computer room 2 or the like, and connected to the electronic component unit 51 in the rear door 12 in a wired or wireless style. The remote controller 52 is provided with an indoor temperature sensor, an operation button, a display unit, a buzzer (sound emitting portion), etc. (not shown). Start/stop of the operation of the electronic device cooling apparatus 40, change of the set temperature T0, notification of various kinds of error messages (display and output of buzzer sounds), etc. are carried out according to the operation of the remote controller. Here, the set temperature T0 is a target temperature of the electronic device cooling unit 20, and an indoor target temperature of the computer room 2 is normally set as the set temperature T0. In the electronic device cooling apparatus 40, the respective parts are controlled so that the temperature of air introduced from the opening of the front side of the cabinet 11 or the temperature of air passed through the evaporating portion 21 is equal to the set temperature T0.

The heat source equipment 30 is disposed outdoors, and it has a compressor 32 for compressing refrigerant, an oil separator 33, a four-way valve 34, a heat exchanger at a thermal source side (condenser) 35, an expansion valve 36 and a receiver tank 37 which are successively connected to one another through pipes in this order. The main liquid pipe 31A is connected to the receiver tank 37, and the main gas pipe 31B is connected through the accumulator 38 to a low-pressure side pipe 41 connected to the inlet port of the compressor 32.

The compressor 32 has an AC compressor for constant-velocity drive (power-fixed type compressor) 32A, and an inverter compressor for frequency-variable drive (power-variable type compressor) 32B, and these compressors 32A and 32B are connected to each other in parallel. The ON/OFF control of the operation of the compressors 32A, 32B and the variable control of the operation frequency of the compressor 32B are performed in accordance with a cooling load, whereby the cooling power of the whole heat source equipment 30 can be made variable.

Describing more specifically, check valves 42A and 42B are provided a the discharge sides of the compressors 32A and 32B, and the oil separator 33, the check valve 43, the four-way valve 34, the thermal-source side heat exchanger 35, the expansion valve 36 and the receiver tank 37 are successively connected to one end of a high-pressure side pipe 42 in this order. The other end of the high-pressure side pipe 42 is branched to two parts and connected to the check valves 42A and 42B. The low-pressure side pipes 41 connected to the suction sides of the compressors 32A and 32B are joined at the downstream side of the accumulator 38, connected to the four-way valve 34 at the upstream side of the accumulator 38, and connected to the main gas pipe 31B through the four-way valve 34. The four-way valve 34 is not switched, but fixed to the state of FIG. 3.

Furthermore, a check valve 44 is connected to the high-pressure side pipe 42 in parallel to the expansion valve 36, and the check valve 44 allows refrigerant flow from the thermal-source side heat exchanger 35 to the receiver tank 37, but prohibits refrigerant from in the opposite direction. Furthermore, a refrigerant return pipe 45 is connected between each of the check valves 42A, 42B and the oil separator 33, and the tip of the refrigerant return pipe 45 is connected to the suction sides of the compressors 32a, 32B. An opening/closing valve 46 is provided to the refrigerant return pipe 45, and a part of refrigerant discharged from the compressors 32A, 32B can be returned to the suction sides of the compressors 32A and 32B by opening the opening/closing valve 46, and thus the discharging power of the compressors 32A, 32B can be reduced.

The high-pressure side pipe 42 is connected to the main liquid pipe 31A through a liquid-side service valve 47, and the low-pressure side pipe 41 is connected to the main gas pipe 31B through a gas-side service valve 48. Oil separated by the oil separator 33 is passed through the oil return pipe 49, and returned to the suction sides of the compressors 32A, 32B. The high-pressure side of one compressor 32A, 32B is connected to the low-pressure side of the other compressor 32B, 32A through the oil return pipe 32C, 32D, and the amount of oil in each of the compressors 32A and 32B is properly adjusted. Furthermore, high-pressure switches 5A and 5B are provided to the discharges sides of the compressors 32A and 32B respectively, and the operation of each of the compressors 32A and 32B is stopped by each of the high-pressure switches 5, 6 when the discharge pressure of each of the compressors 32A and 32B exceeds the upper limit of a permissible range.

The heat source equipment 30 has an electronic component unit 61, and the electronic component unit 61 is connected to the electronic component unit 51 of the electronic device cooling unit 20 connected to the heat source equipment 30 through an external and internal communication line so that communications can be performed between the electronic component unit 61 and the electronic component unit 51. The electronic component unit 61 transmits/receives a control signal and an operation signal with the electronic component unit 51 of each electronic device cooling unit 20, and also an operation of the remote controller 52 provided to the electronic device cooling unit 20 side is input to the electronic component unit 61 to control the respective parts of the electronic device cooling apparatus 40.

In the electronic device cooling device 40, the pressure compressors 32A and 32B are driven under the control of the electronic component unit 61 of the heat source equipment 30. In this case, the electronic component unit 51 controls the ON/OFF operation and the operation frequency of each of the compressors 32A and 32B on the basis of the temperature corresponding to the difference (temperature difference) between the outdoor temperature T2 detected by the temperature sensors (not shown) and the indoor temperature T1 detected by the remote controller 52, and also the electronic component unit 61 detects the inlet and outlet port temperatures of the heat-source side heat exchanger 35 by the temperature sensors (not shown) and controls the valve opening degree of the expansion valve 36 so that the temperature difference between the temperature of the inlet port and the temperature of the outlet port is in a proper range.

In this case, the high-temperature and high-pressure refrigerant discharged from the compressors 32A and 32B are condensed and liquefied in the heat-source side heat exchanger 35, passed through the main liquid pipe 31A extending from the heat source equipment 30 and then supplied to the electronic device cooling unit 20.

In each electronic device cooling unit 20, the liquid refrigerant flowing through the main liquid pipe 31A passes through the flexible liquid pipe 25 and flows to the liquid pipe 27, and branched to the two systems. In one system, the refrigerant passes through the expansion valve 28A and flows through the upper evaporating portion 22. In the other system, the refrigerant passes through the expansion valve 28B and flows through the evaporating portion 23. The refrigerant is evaporated and gasified in each of the evaporating portions 22, 23, and air passing through the evaporating portions 22 and 23 is cooled by evaporation heat of the refrigerant in each of the evaporating portions 22 and 23.

The refrigerant gasified in one of the evaporating portions 22 and 23 is joined to the refrigerant gasified in the other evaporating portion, and then the joined refrigerant passes through the flexible gas pipe 26, flows through the main gas pipe 31B and returns to the heat source equipment 30. The refrigeration cycle is performed as described above.

Next, the server rack will be described.

Figure 4:
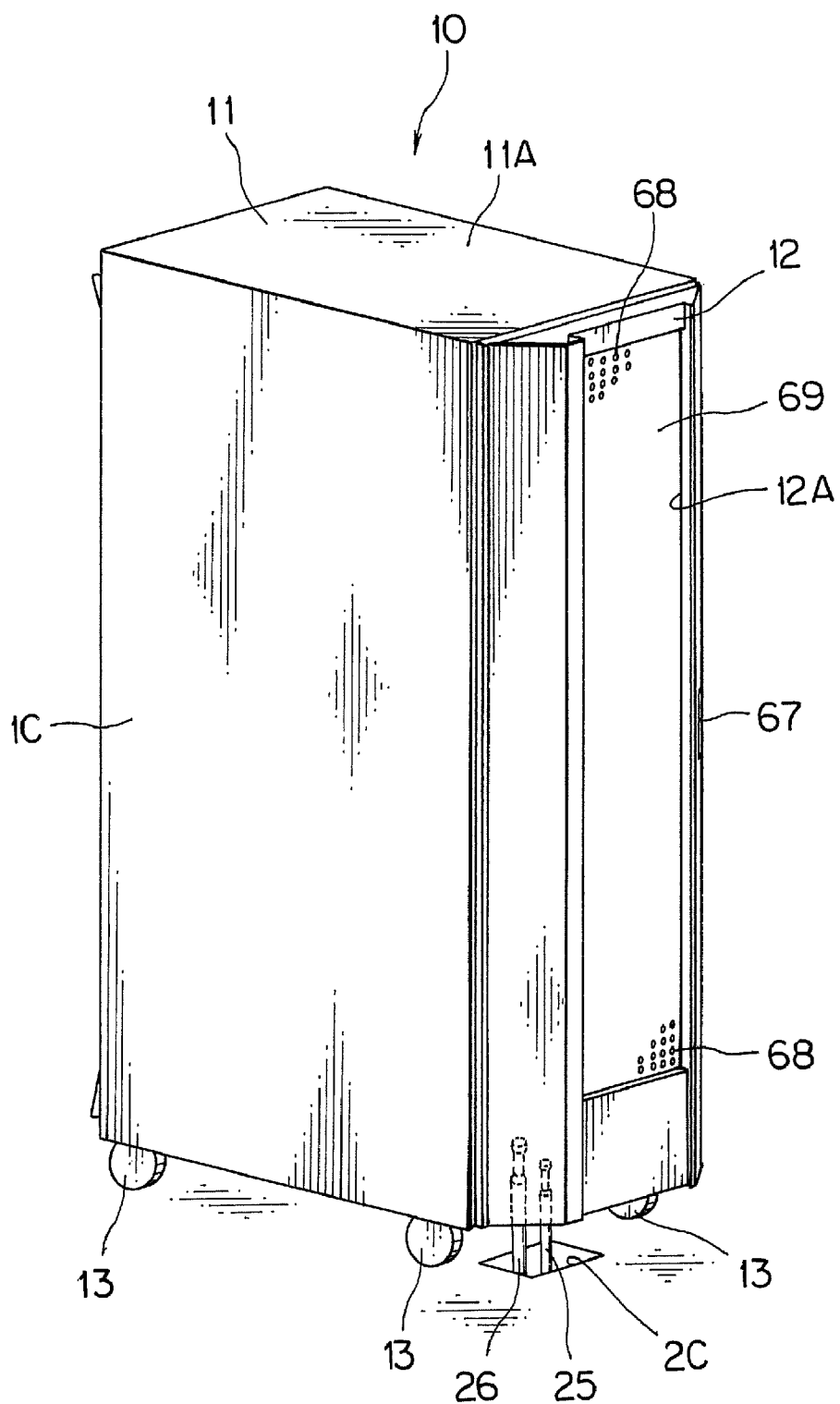
FIG. 4 is a perspective view showing the outline of the server rack.
Figure 5:
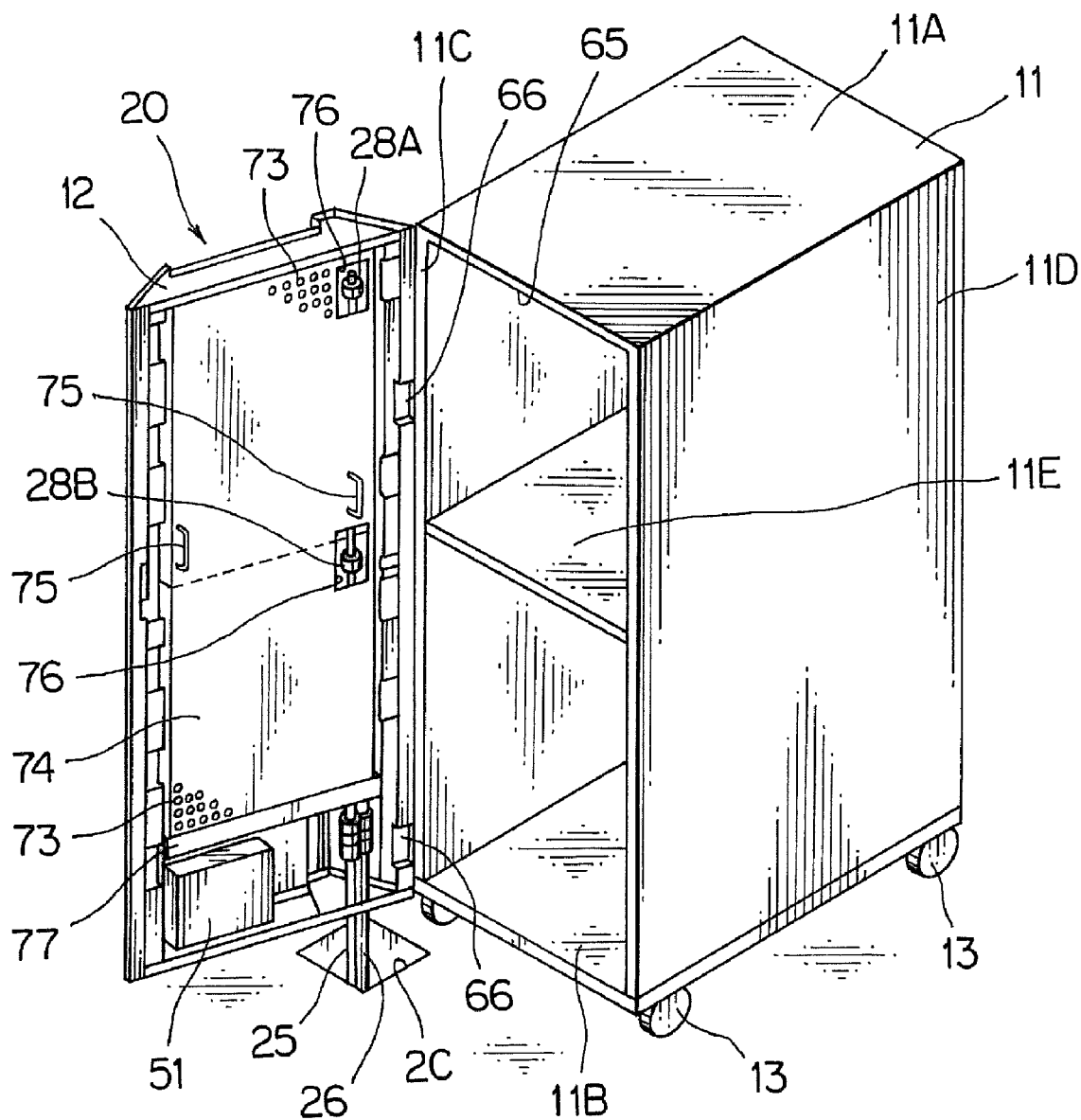
FIG. 5 is a perspective view of the server rack under the state that a rear door is opened.

FIG. 4 is a diagram showing the outlook of the server rack, and FIG. 5 is a perspective view of the server rack when the rear door is opened. The server rack 10 has the cabinet 11 in which the electronic devices 3 (see FIG. 2) are accommodated, and the rear door 12 that is opened/closed so as to freely cover the rear-side opening of the cabinet 11.

The cabinet 11 has a size which is matched with the standard of the electronic devices to be accommodated, and it is designed in a rectangular shape to have a top plate 11A, a bottom plate 11B and side plates 11C and 11D which are formed of steel plates. The front-side opening 64 (see FIG. 1) and the rear-side opening 65 are formed at the front side and the back side of the cabinet 11 respectively, and indoor air of the computer room 2 flows through the openings 64 and 65 into the cabinet 11. The cabinet 11 has a partition plate (shelf portion) 11E between the top plate 11A and the bottom plate 11B so as to be disposed substantially in parallel to the top plate 11A and the bottom plate 11B. This partition plate 11E partitions the inside of the cabinet 11 into upper and lower spaces. The electronic devices 3 are disposed on the partition plate 11E. The partition plate 11E is supported by plural support portions (not shown) formed on both the side plates 11C, 11D, and the support portions are disposed so as to be spaced from one another at predetermined intervals in the vertical direction. Accordingly, the partition plate 11E can be disposed on the support portions at a desired position, or plural partition plates 11E may be disposed in the cabinet 11.

The rear door 12 is formed by bending a metal (for example, aluminum) plate. One end side of the rear door 12 is joined to the cabinet 11 through a hinge 66, and a handle 67 which is operated when the rear door 12 is opened/closed is provided to the other end side of the rear door 12. When the handle 67 is operated to be pulled to the front side, the rear door 12 is turned around the hinge 66 as shown in FIG. 5, and the rear-side opening 65 of the cabinet 11 is opened.

Furthermore, as shown in FIG. 4, an opening portion 12A is formed substantially at the center portion of the outer surface of the rear door 12, and a surface member 69 in which holes 68 each having a predetermined diameter are formed substantially all over is disposed at the opening portion 12A. The surface member 69 enables the rear door 12 to be ventilated through the respective holes 68, and also prevents the evaporator 21 disposed in the rear door 12 from being exposed to the outside, thereby enhancing the beauty of the exterior appearance of the server rack 10.

Here, each hole 68 of the surface member 69 is formed so that the aperture rate thereof is equal to 60% or more to prevent the ventilation from being disturbed by the surface member 69. In addition, the diameter of the hole 68 is set to be smaller than the diameters of human's fingers. Accordingly, for example, an operator operating the electronic devices 3 disposed in the server rack 10 can be prevented from touching the evaporator 21 through the holes 68, and thus the operator can be prevented from suffering an accident such as injury of his/her finger by the fan of the evaporator 21 before happens.

Figure 6:
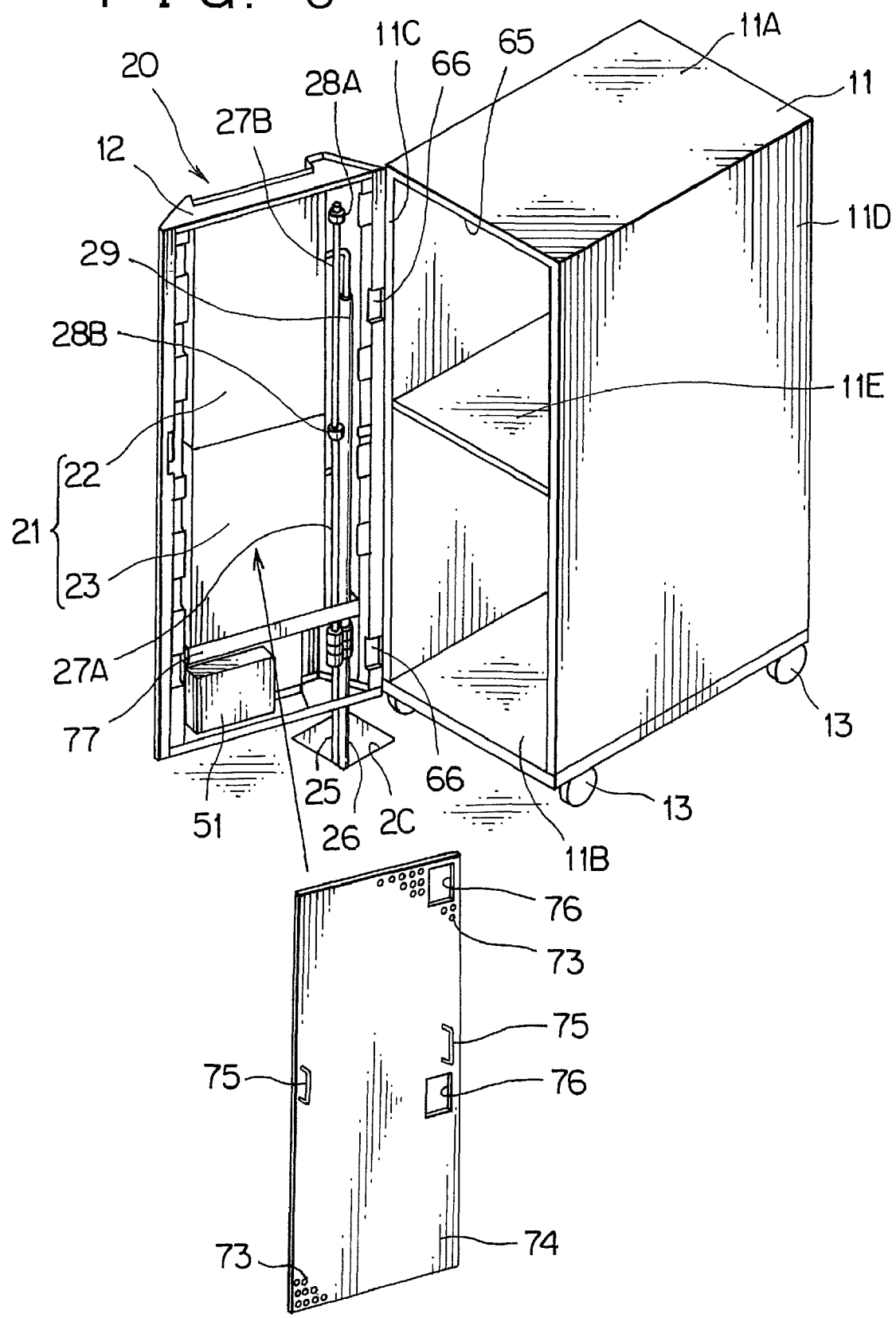
FIG. 6 is a perspective view showing a state that a cover member is detached from the state of FIG. 5.

As shown in FIG. 6, the evaporator 21 disposed substantially over the whole area of the rear door 12, the expansion valves 28A and 28B provided to the liquid branch pipes 27A and 27B connected to the evaporator 21 and the electronic component unit 51 for controlling the opening degree of each of the expansion valves 28A and 28B are integrally provided on the inner surface of the rear door 12. As described above, the evaporator 21, the expansion valves 28A and 28B and the electronic component unit 51 are integrally disposed on the inner surface of the rear door 12, whereby these elements can be handled as the integral electronic device cooling unit 20. In addition, by connecting this electronic device cooing unit 20 to the heat source equipment 30, heat radiated from the electronic devices 3 can be simply cooled.

Figure 7:
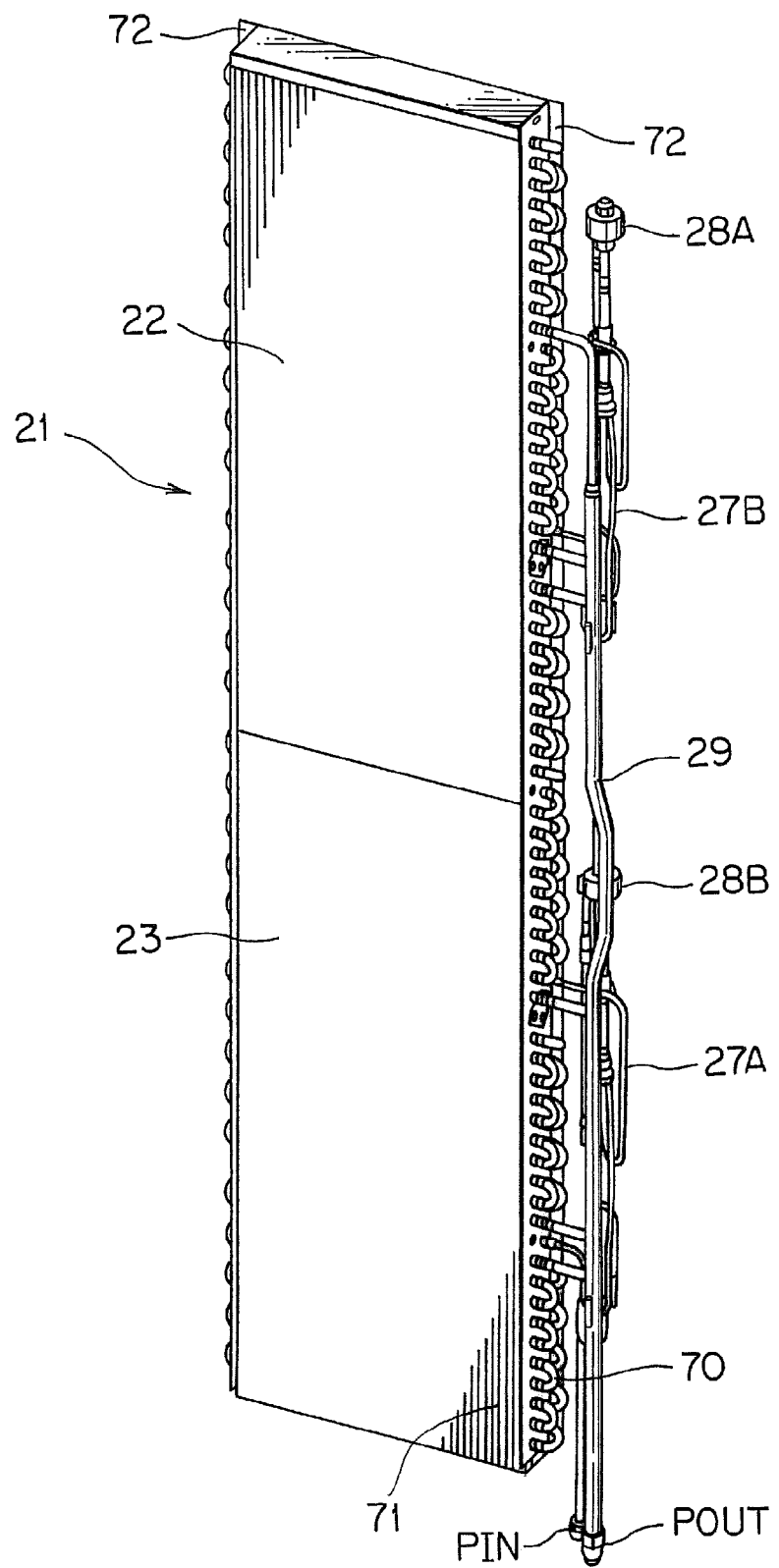
FIG. 7 is a perspective view showing the construction of an evaporator.

As shown in FIGS. 6 and 7, the evaporator 21 is divided into the upper evaporating portion 22 and the lower evaporating portion 23 with the substantially intermediate portion of the cabinet in the vertical direction as the boundary (that is, the partition plate 11E provided to the cabinet 11 in advance is as the boundary). Each of the upper evaporating portion 22 and the lower evaporating portion 23 is equipped with the liquid branch pipe 27A, 27B having a small diameter and the gas pipe 29 having a large diameter, and the liquid branch pipes 27A, 27B and the gas pipe 29 are collectively disposed at the hinge side 66 of the rear door 12. In this construction, as shown in FIG. 6, the gas pipe 29 is disposed to be nearer to the hinge 66 side of the rear door 12 than the liquid pipe 27 (the liquid branch pipes 27A, 27B). Therefore, the large-diameter flexible gas pipe 26 connected to the gas pipe connection portion POUT of the gas pipe 29 is disposed to be nearer to the hinge 66, and thus the slack amount of the flexible gas pipe 26 can be suppressed to a small value, so that the rear door 12 can be smoothly opened/closed by small force.

As shown in FIG. 7, the evaporator 21 is a fin-tube type heat exchanger comprising a refrigerant pipe 70 through which refrigerant flows, and plural heat-radiating fins 71 which are stacked so that the refrigerant pipe 70 penetrates through the heat-radiating fins 71. Pipe plates 72 are disposed at both the ends of the evaporator 21 so as to press the fins 71. The pipe plate 72 is designed substantially in L-shape to have a fixing portion 72A extending substantially in parallel to the rear door 12 at the rear door 12 side thereof when the evaporator 21 is disposed in the rear door 12 (see FIG. 6). In this embodiment, the evaporator 21 is fixed to the rear door 12 through the fixing portion 72A by screws, whereby As shown in FIG. 6, the electronic component unit 51 is disposed in an area below the evaporator 21. According to this arrangement, a part of air cooled by the evaporator 21 flows downwardly to cool the electronic component unit 51, and thus it is unnecessary to provide cooling equipment to the electronic component unit 51 itself. Furthermore, the electronic component unit 51 is disposed at the lower side of the evaporator 51, and thus the internal and external communication line 62 (see FIG. 3) for connecting the electronic component unit 51 and the electronic component unit 61 of the heat source equipment 30 (see FIG. 3) is passed through the opening hole 2C together with the flexible pipes 25, 26, and also routed in the underfloor space between the upper floor 2A and the lower floor 2B. Accordingly, the length of the internal and external communication line 62 can be shortened. Therefore, the internal and external communication line 62 is prevented from suffering noise, and the expansion valves 28A, 28B connected to the electronic device cooling unit 20, that is, the evaporator 21 can be stably operated.

In this embodiment, as shown in FIGS. 5 and 6, a cover member 74 in which holes 73 each having a predetermined diameter are formed substantially all over is disposed on the inner surface of the rear door 12 so as to cover the evaporator 21. The cover member 74 are formed by a punching plate as in the case of the surface member 69, and the rear door 12 is ventilated through the respective holes 73.

The cover member 74 is used to prevent a person other than a service man of the electronic device cooling unit 20 from erroneously touching the fins of the evaporator 21 even when the rear door 12 is opened. The cover member 74 is fixed to the rear door 12 through screw holes (not shown) formed on the periphery of the cover member 74. Here, it is desired that some of the screw holes are designed as gourd-shaped holes and the cover member 74 is hooked through the gourd-shaped holes to screws which are temporarily fixed to the rear door 12. According to this construction, the cover member 74 can be temporarily fixed to the rear door 12 in a maintenance work, and thus the cover member 74 can be easily attached/detached to/from the rear door 12.

Furthermore, the cover member 74 has a pair of handles 75 for handling the cover member 74. The handles 75 are secured to both the edge portions at the center portion in the height direction of the cover member 74, and thus they do not disturb ventilation.

As shown in FIG. 5, openings 76 are formed in the cover member 74 so as to face the expansion valves 28A and 28B when the cover member 74 is attached to the rear door 12. The openings 76 serve as windows when a maintenance work is executed on the expansion valves 28A and 28B. For example, the operation of the expansion valves 28A, 28B can be checked through the openings 76, or when coil portions of the expansion valves 28A, 28B become defective, the coil portions can be exchanged by new ones through the openings 76.

Figure 8:
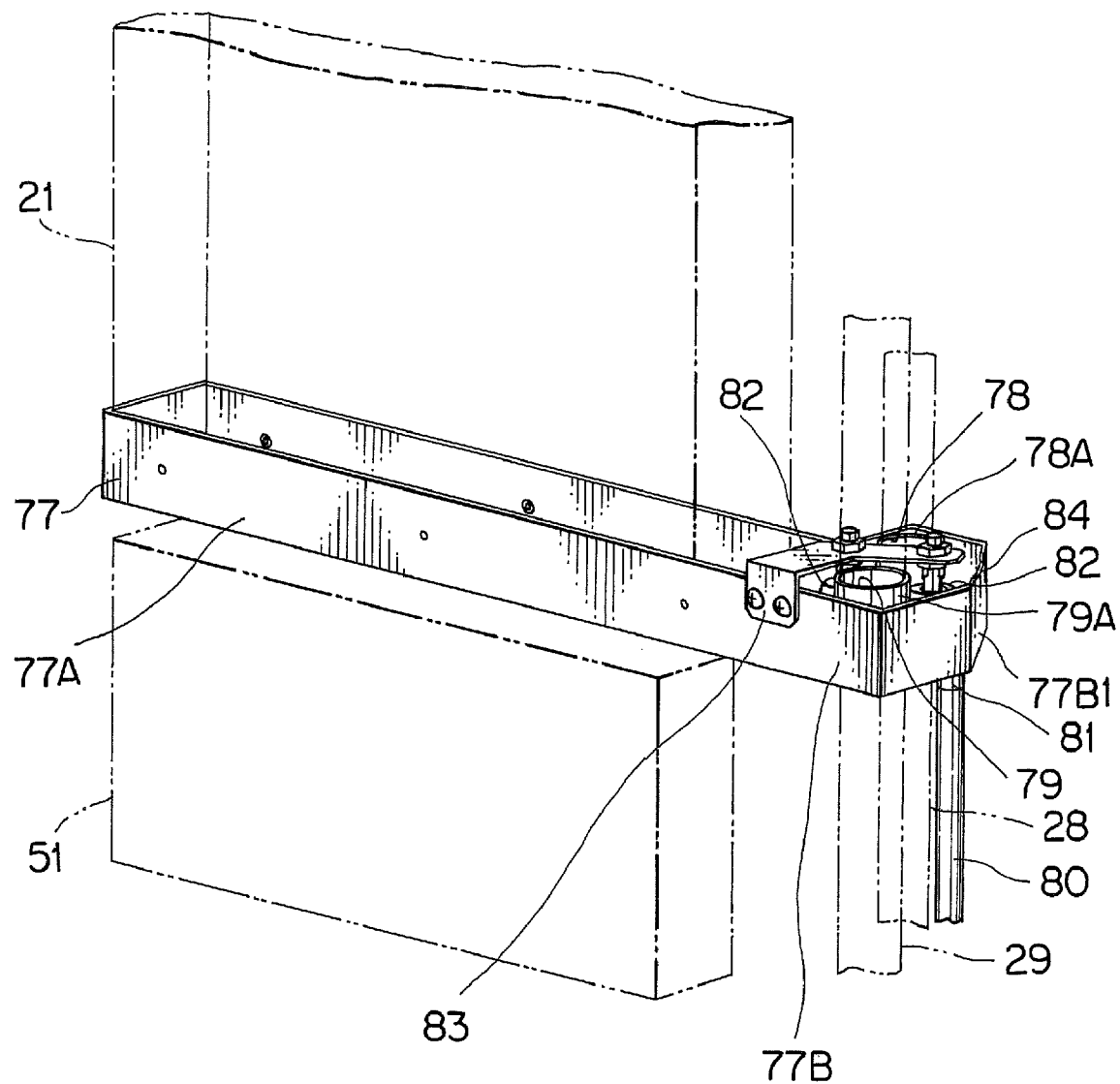
FIG. 8 is a perspective view showing the construction of a drain pan.

As shown in FIGS. 5 and 6, a drain pan 77 for receiving drain water dropped from the evaporator 21 is provided below the evaporator 21. As shown in FIG. 8, the drain pan 77 is located above the electronic component unit 51, and the drain water can be prevented from dropping to the electronic component unit 51.

In this construction, the computer room 2 is kept under predetermined temperature and humidity (for example, 25° C. 50%), and the electronic component unit 61 controls the operation of the compressor 32 so that no dew condensation occurs under this temperature and humidity condition.

Accordingly, under a normal operation state, it is not assumed that drain water is stocked in the drain pan 77. However, even when dew condensation occurs in the evaporator 21 due to some cause, this condensation water (drain water) is prevented from dropping to the electronic component unit 51.

Figure 9:
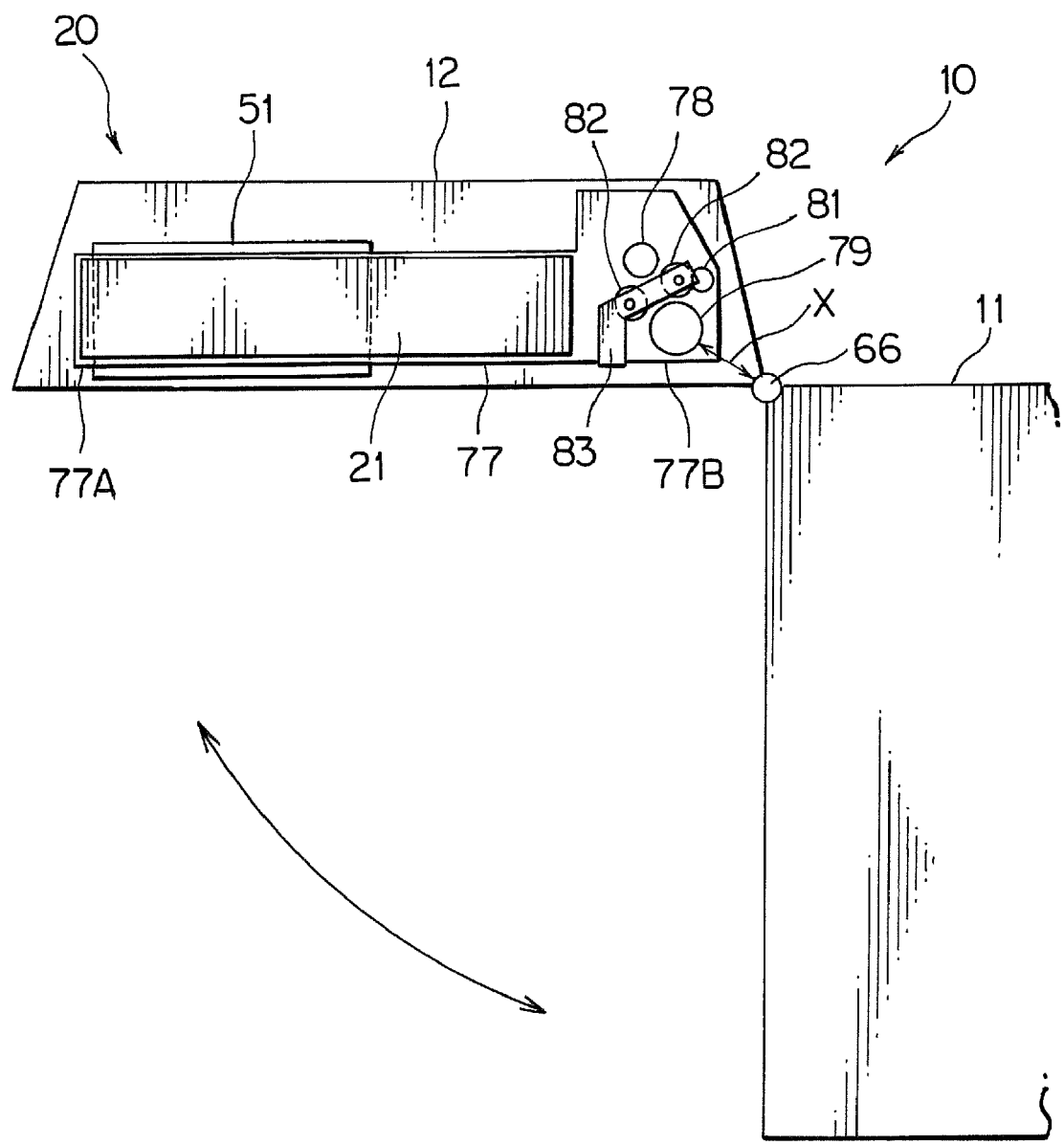
FIG. 9 is a top view of the drain pan.

As shown in FIGS. 8 and 9, the drain pan 77 has a main body portion 77A located at the lower side of the evaporator 21, and an extension portion 77B extending to the hinge 66 side of the rear door 12. The extension portion 77B is designed to be larger in width in the thickness direction of the rear door 12 than the main body portion 77A. As shown in FIG. 8, a liquid pipe penetrating hole portion 78 having a small diameter through which the liquid pipe 27 penetrates and a gas pipe penetrating hole portion 79 having a large diameter through which the gas pipe 29 penetrates are formed in the extension portion 77B. These hole portions 78 and 79 have cylindrical banks 78A and 79A formed around the hole portions 78 and 79 respectively, and the height of each of the banks 78A and 79A is substantially equal to the height of the drain pan 77.

As shown in FIG. 9, the gas pipe penetrating hole portion 79 is formed in the neighborhood of a corner portion of the extension portion 77B which is nearer to the hinge 66 of the rear door 12. According to this construction, the distance X between the hinge 66 and the gas pipe 29 through which the gas pipe penetrating hole portion 79 penetrates can be shortened, and thus the flexible gas pipe having a large diameter which is connected to the gas pipe connection portion POUT of the gas pipe 29 can be disposed to be nearer to the hinge 66. Therefore, when the rear door 12 is opened/closed, the slack (sag) amount of the flexible gas pipe 26 can be suppressed to a small value, so that the rear door 12 can be smoothly opened/closed.

The liquid pipe penetrating hole portion 78 is located not to be overlapped with the gas pipe penetrating hole portion and also so as to be as short as possible in the distance from the hinge 66 when it faces the rear door 12. Specifically, the liquid pipe penetrating hole portion 78 is located to be nearer to the evaporator 21 and the rear door 12. According to this arrangement, the liquid pipe 27 passing through the liquid pipe penetrating hole portion 78 is located substantially beneath the liquid pipe penetrating hole portion 78, and thus when the flexible liquid pipe 25 is connected to the liquid pipe connection portion PIN (see FIG. 7) of the liquid pipe 27, the gas pipe penetrating through the gas pipe penetrating hole portion 79 does not disturb the connection between the flexible liquid pipe and the liquid pipe connection portion PIN (see FIG. 7) and the pipe connection work can be easily performed. Furthermore, the liquid pipe 27 can be located to be as near as possible to the hinge 66, so that the small-diameter flexile liquid pipe connected to the liquid pipe connection portion PIN of the liquid pipe 27 can be located to be as near as possible to the hinge 66. Therefore, when the rear door 12 is opened/closed, the flexible liquid pipe 25 can be prevented from sagging and disturbing the opening/closing of the rear door 12.

Figure 10:
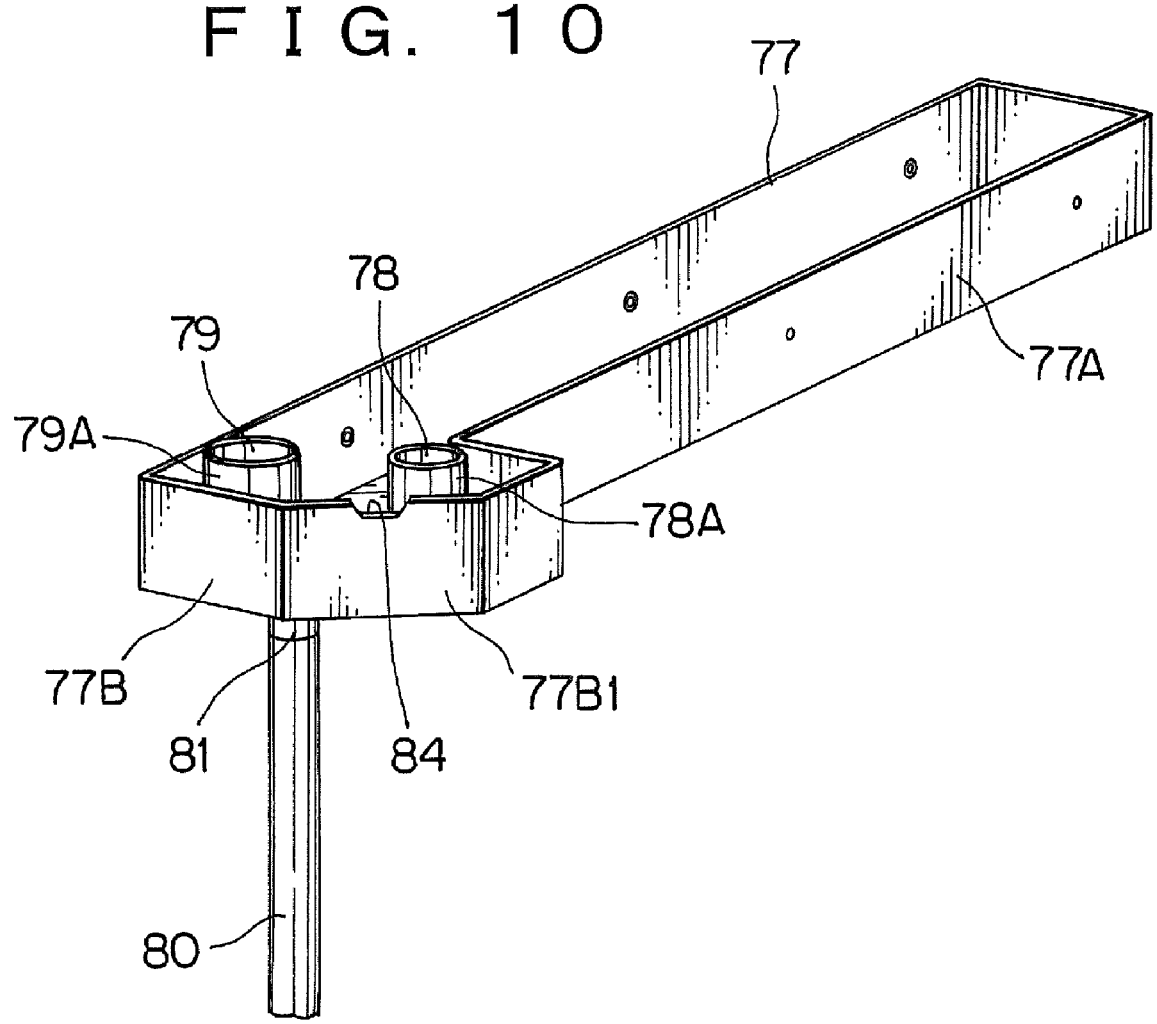
FIG. 10 is a perspective view of the drain pan.

As shown in FIG. 10, a hose connection port 81 to which a drain hose for discharging drain water stocked in the drain pan 77 is formed in the bottom surface of the extension portion 77B of the drain pan 77. The hose connection port 81 is formed to be arranged with the hole portions 78 and 79, and the drain hose 80 connected to the hose connection port 81 passes through the opening hole 2C and extends to the underfloor space between the upper floor 2A and the lower floor 2B together with the flexible pipes 25 and 26, and the drain water is discharged to a side ditch (not shown) which is formed in the underfloor space in advance. The side ditch is formed to be lower than the arrangement position of the main refrigerant pipe 31, the internal and external communication line 62, etc. extending from the heat source equipment 30, and water flowing through the side ditch is prevented from overflowing onto the lower floor 2B.

Furthermore, in the above construction, a float switch 82 for detecting that the amount of drain water stocked in the drain pan 77 is equal to a predetermined amount or more is provided to the extension portion 77B of the drain pan 77 as shown in FIG. 8. The height position of the float switch 82 varies in accordance with the water level, and in this embodiment, plural (two) float switches 82 which operate at the same height are disposed.

Each of the float switches 82 is secured to a bracket 83 which is fixed to the extension portion 77B by screws, and the respective float switches 82 are connected to the electronic component unit 51 in parallel. Accordingly, when at least one of the float switches 82 operates, a detection signal is transmitted to the electronic component unit 61 of the heat source equipment 30 through the electronic component unit 51, and the electronic component unit 61 forcedly stops the operation of the compressor 32. Therefore, drain water can be prevented from being further stocked in the drain pan 77, and thus such a situation that drain water overflows from the drain pan 77 can be prevented.

Furthermore, in the above construction, the float switches 82 are connected to the electronic component unit 51 in parallel. Accordingly, even when one float switch 82 fails in operation because it bites dust or the like, the operation of the compressor can be stopped by the other float switch 82. Therefore, occurrence of the situation that drain water can be prevented from overflowing due to failure of the operation of the float switch 82 can be kept to a minimum.

Still furthermore, in this construction, a cut-out portion 84 is formed in the extension portion 77B of the drain pan 77 by cutting out a part of the edge portion of the wall surface of the extension portion 77B so that the edge of the cut-out portion is positionally lower than the edge of the other wall surface portion as shown in FIG. 10. The cut-out portion 84 is formed in a wall portion 77B1 of the wall surface of the extension portion 77B of the drain pan 77, which is located at the farthest position from the electronic component unit 51 as shown in FIG. 8. Even if drain water is stocked in the drain pan 77 by a predetermined amount or more due the operational failure of the float switch 82, the drain water is discharged through the cut-out portion 84 to the outside of the drain pan 77.

As described above, the cut-out portion 84 is formed in the wall portion 77B which is farthest from the electronic component unit 51. Therefore, even if drain water overflows from the drain pan 77, the water overflowing through the cut-out portion 84 flows along the liquid pipe 27, the gas pipe 29, the drain hose 80, etc. to the opening hole 2C formed in the upper floor 2A, and thus this water can be prevented from dropping onto the electronic component unit 51.

Next, the connection between the main liquid pipe 31A and the main gas pipe 31B and the connection between the flexile liquid pipe 25 and the flexible pipe 26 will be described.

As shown in FIG. 1, the cabinet 11 of the server rack 10 is mounted on the double flooring having the lower floor 2B and the upper floor 2A which is disposed above the lower floor 2B through a space, and the main liquid pipe 31A and the main gas pipe 31B extending from the heat source equipment 30 are arranged in the space between the lower floor 2B and the upper floor 2a, and routed in the width direction of the computer room 2.

As shown in FIG. 3, the main liquid pipe 31A and the main gas pipe 31B are provided with plural (five in this embodiment) connection ports P1A to P5A and P1B to P5B for connecting the flexible liquid pipe and the flexible gas pipe.

Figure 11:
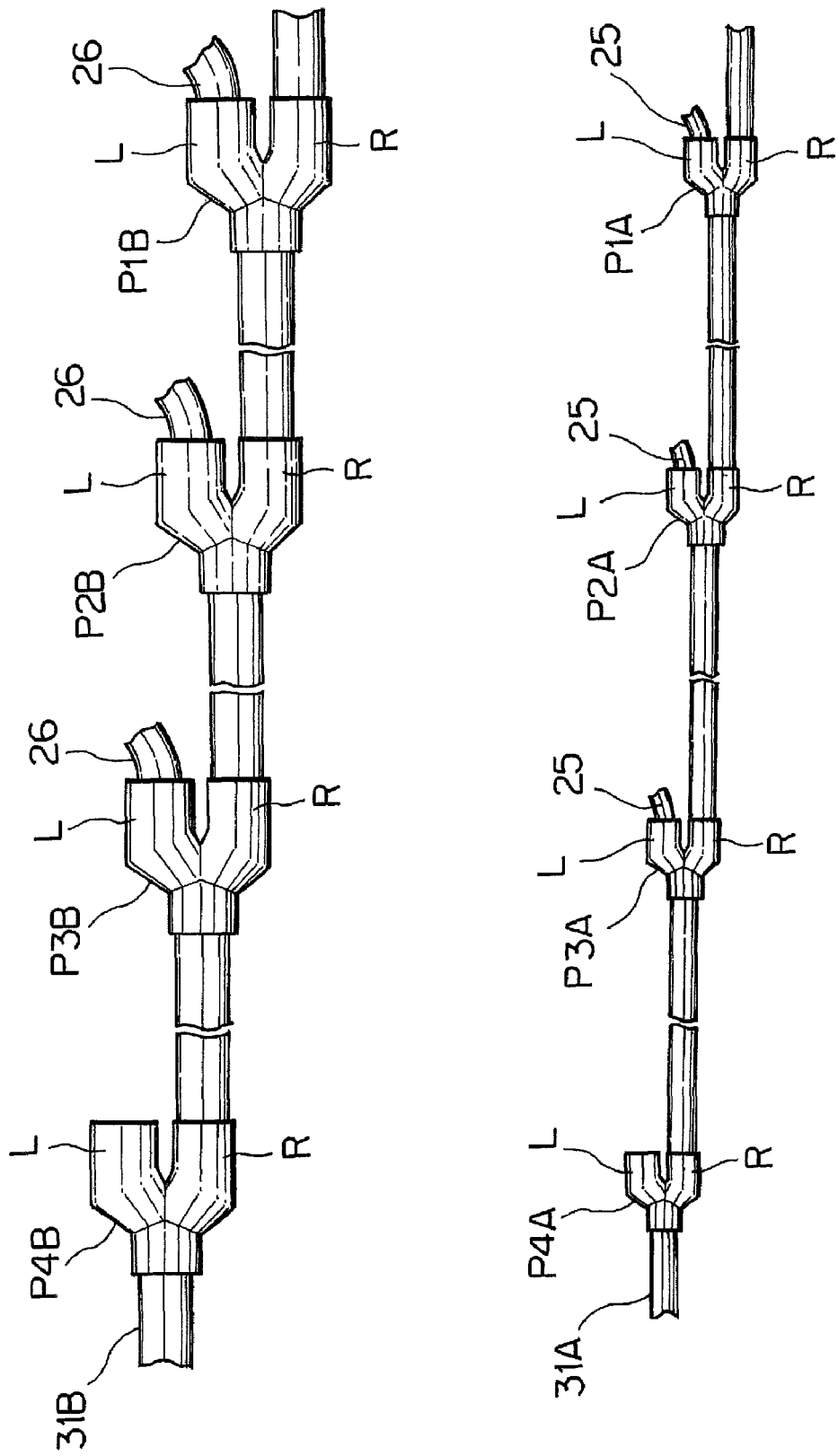
FIG. 11 is a diagram showing a connection ports of a main liquid pipe and a main gas pipe.

FIG. 11 is a diagram showing the connection ports P1A to P5A and P1B to P5B of the main liquid pipe 31A and the main gas pipe 31B.

As shown in FIG. 11, two-distribution type connection ports are applied as the connection ports P1A to P5A and P1B to P5B provided to the main liquid pipe 31A and the main gas pipe 31B. Each of the main liquid pipe 31A and the main gas pipe 31B is joined to one port R, and the connection ports P1A to P5A and P1B to P5B are provided so as to be spaced from one another at predetermined intervals in the extension direction of the main liquid pipe 31A and the main gas pipe 31B.

Therefore, as shown in FIG. 1, the main liquid pipe 31A and the main gas pipe 31B are routed along the arrangement of the cabinet 11, whereby the connection ports P1A to P5A and P1B to P5B of the main liquid pipe 31A and the main gas pipe 31B can be arranged to be proximate to each cabinet 11.

In this construction, the flexible liquid pipes 25 and the flexible gas pipes 26 are connected to the other ports L of the three pairs of connection ports P1A to P3A and P1B to P3B out of the connection ports P1A to P5A and P1B to P5B, thereby connecting three electronic device cooling units 20 (evaporators 21).

In this case, the flexible liquid pipe 25 and the flexible gas pipe 26 pass through the opening hole 2C (see FIG. 2) of the upper floor 2A and connects to the evaporator 21 provided to the rear door 12. Therefore, as shown in FIG. 2, the flexible liquid pipe 25 and the flexible gas pipe 26 extend downwardly from the evaporator 21, and they are routed to be gently bent in the underfloor space. The flexible pipes 25 and 26 are designed to be extra long, whereby only the flexible pipes 25, 26 are moved in conformity with the movement of the rear door 12 when the rear door 12 is opened/closed. Accordingly, no force acts on the other pipes when the rear door 12 is opened/closed, and thus steel pipes may be used as the other pipes, for example, the main liquid pipe 31A and the main gas pipe 31B.

Furthermore, the remaining two pairs of connection ports P4A, P5A and P4B, P5B are used as connection ports for adding a new electronic device cooling unit 20 (evaporator 21) or heat source equipment 30. That is, with respect to these connection ports P4A, P5A and P4B, P5B for expansion, stoppers (not shown) are put on empty ports L under nonuse (no expansion (addition)), and the flexible liquid pipe 25 and the flexible gas pipe 26 are connected to the empty ports L to connect a device to be added (evaporator 21 or heat source equipment 30) under use (expansion (addition)). The main liquid pipe 31A and the main gas pipe 31B are formed to be larger in diameter (thicker) in advance so as to secure a refrigerant flow amount required when equipment to be added (evaporator 21 or heat source equipment 30) is connected.

Accordingly, even when the evaporators 21 or the heat source equipment 30 are connected to all the connection ports P1A to P5A and P1B to P5B, it is unnecessary to exchange the main liquid pipe 31A and the main gas pipe 31B, and the existing main liquid pipe 31A and the existing main gas pipe 31 can be continually used.

As described above, according to this embodiment, the main liquid pipe 31A and the main gas pipe 31B extending from the heat source equipment are formed to be larger in diameter in advance so that heat source equipment 30 or an evaporator 21 can be newly added, and the connection ports P4A, P5A and P4B, P5B for addition (expansion) are provided to the main liquid pipe 31A and the main gas pipe 31B, whereby the heat source equipment 30 or the evaporator 31 can be easily added without exchanging the main liquid pipe 31A and the main gas pipe 31B.

Therefore, when a server or network equipment is additionally provided, a cabinet 11 in which the equipment concerned is mounted will be additionally provided. In this case, addition of new evaporators 21 corresponding to the added cabinet 11 can be easily performed. Furthermore, even when it is necessary to additionally provide heat source equipment 30 in connection with the addition of these new evaporators 21, the heat source equipment 30 can be easily additionally provided.

Furthermore, the evaporator 21 is connected through the flexible liquid pipe 25 and the flexible gas pipe 26. Therefore, the evaporator 21 can be easily moved and the layout of the cabinet 11 when an evaporator is additionally provided can be easily changed, so that the adding (expansion) work can be more easily performed. Still furthermore, since the main liquid pipe 31A and the main gas pipe 31B are disposed in the space of the double flooring, the main refrigerant pipe 31 does not exist on the upper floor 2A of the computer room 2, and it does not disturb a worker moving in the computer room 2.

The present invention is not limited to the above embodiment, and various modifications may be made on the basis of the technical idea of the present invention. For example, in the above embodiment, the connection ports P1A to P5A and P1B to P5B are provided so as to be spaced from one another at predetermined intervals in the direction along which the main liquid pipe 31A and the main gas pipe 31B extend, however, the present invention is not limited to this style.

Figure 12:
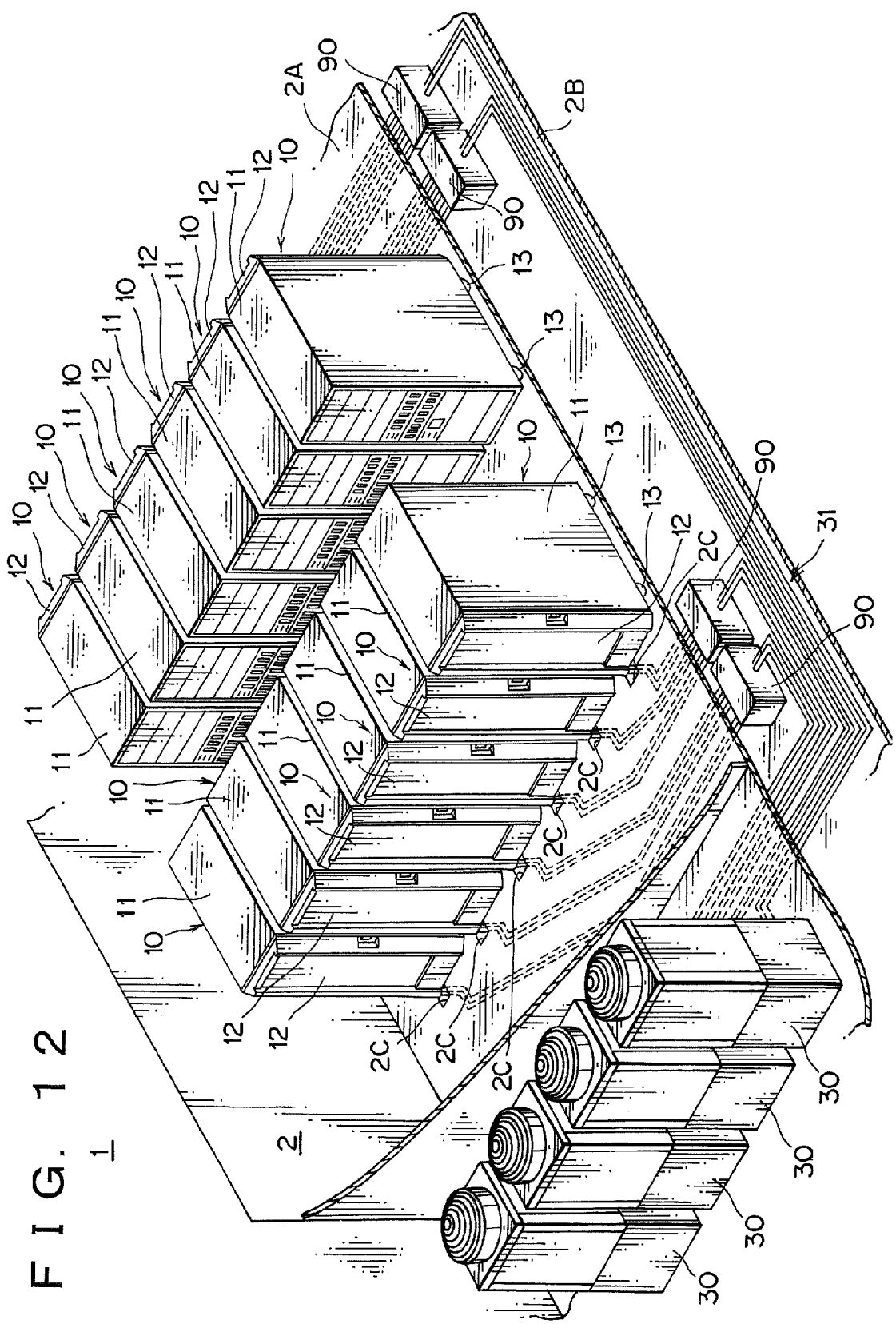
FIG. 12 is a diagram showing an electronic device cooling system using a branch unit.

For example, as shown in FIG. 12, a branch unit 90 for branching the main liquid pipe 31A and the main gas pipe 31 may be provided, and plural connection ports may be provided to the branch unit 90. The branch unit 90 is disposed in the underfloor space of the double flooring, and the flexible liquid pipes 25 and the flexible gas pipes 26 connected to the heat source equipment 30 and the evaporators 21 are concentratively connected to the branch unit 90.

In this construction, the plural connection ports are collectively disposed in the branch unit 90, and thus the connection working area for the plural flexible liquid pipes 25 and flexible gas pipes 26 can be fixed to one place. Furthermore, when the branch unit 90 is exchanged by a branch unit having a large number of connection ports, a larger number of heat source equipment 30 and evaporators 21 can be additionally provided.

Here, as described above, the main liquid pipe 31A and the main gas pipe 31B extending from the heat source equipment 30 are provided with plural (five in this embodiment) connection ports P1A to P5A and P1B to P5B for the flexible liquid pipe and the flexible gas pipe. In this construction, one ends of the flexible liquid pipes 25 and the flexible gas pipes 26 are connected to three pairs of connection ports P1A to P5A and P1B to P5B, thereby three electronic device cooling units 20 (evaporators 21) are connected to the heat source equipment 30, and the remaining two pairs of connection ports P4A, P5A and P4B, P5B are used as expansion connection ports which are used when electronic device cooling units or evaporators 30 are additionally provided. That is, the remaining two pairs of connection ports P4A, P5A, P4B and P5B are used as connection ports for connecting electronic device cooling units 20 to be added when a server rack 10 is added, or as connection ports for connecting heat source equipment 30 to be added.

The other end of each flexible liquid pipe 25 is connected to the liquid pipe connection portion PIN of the electronic device cooling unit 20. The refrigerant pipe 27 extending from the liquid pipe connection portion PIN is branched to two branch pipes. One branch pipe 27A is connected through the expansion valve 28A to the inlet port of the upper evaporating portion 22, and the other branch pipe 28B is connected through the expansion valve 28B to the inlet port of the lower evaporating portion 23.

The outlet ports of the evaporating portions 22, 23 are connected to the joint refrigerant pipe (gas pipe) 29, and the flexible gas pipe 26 is connected to the gas pipe connection portion POUT provided to the end portion of the joint refrigerant pipe 29. Accordingly, the refrigerant pipe can be connected so that the refrigerant can be made to selectively flow through each of the evaporating portions 22, 23 in the electronic device cooling unit 20.

As described above, the evaporator 21 of the electronic device cooling unit 20 is connected through the flexible liquid pipe 25 and the flexible gas pipe 26, and thus the flexible pipes 25, 26 can be prevented from sagging and thus disturbing the opening/closing of the rear door 12 when the rear door 12 is opened/closed. Furthermore, the position of the server a rack 10 can be finely adjusted while these pipes are connected.

Here, it is general that the computer room 2 is managed to keep a fixed humidity and a fixed temperature, and a set exhaust heat temperature (for example, 25° C.) at which no dew condensation occurs is determined in accordance with the humidity condition and the temperature condition. In this construction, the set exhaust heat temperature is set as a set temperature T0 in the remote controller 52. In the computer room 2, plural electronic devices 3 are actuated basically restlessly, and it is kept under an unmanned state for a long time. Therefore, it is required to avoid occurrence of dew condensation in the computer room 2 at maximum.

Therefore, according to this embodiment, in order to avoid dew condensation in the electronic device cooling apparatus 40, first dew condensation preventing control for managing exhaust heat temperature after the refrigerant passes through the evaporator 21 and second dew condensation preventing control for managing refrigerant temperature when the refrigerant passes through the evaporator 21 are carried out.

Figure 13:
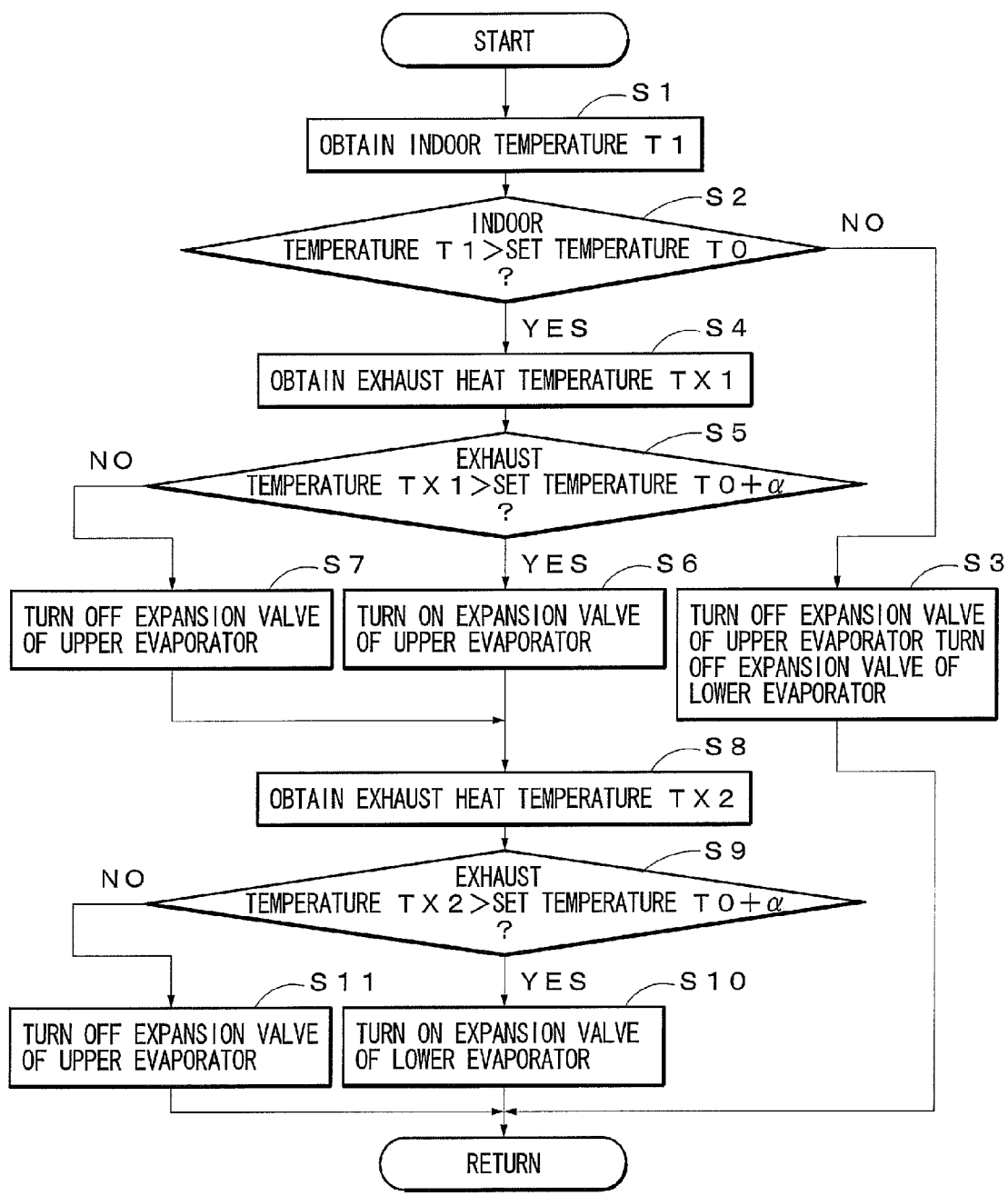
FIG. 13 is a flowchart showing first dew condensation control.

FIG. 13 is a flowchart showing the first dew condensation preventing control. The electronic component unit (controller) 51 of the electronic device cooling unit 20 obtains an indoor temperature T1 detected by the remote controller 52 (step S1), and judges whether the indoor temperature T1 is higher than the set temperature T0 (step S2). If the indoor temperature T1 is equal to or less than the set temperature T0 (step S2: No), the computer room 2 is judged to be excessively cooled, and thus OFF flags corresponding to the expansion valves 28A and 28B are set in a predetermined area of a memory (not shown) in the electronic component unit 51 to prohibit the cooling of the evaporator 21 (OFF) (step S3).

In the above judgment, if the indoor temperature T1 is higher than the set temperature T0, the electronic component unit 51 obtains an exhaust heat temperature TX1 of the evaporator 22 (step S4), and it is judged whether the exhaust heat temperature TX1 is higher than a threshold value (set temperature T0 of the remote controller 52+sever exhaust heat shift value α) (step S5). Here, the server exhaust heat shift value α is a margin value for judging whether the exhaust heat temperature TX1 is sufficiently higher than the set temperature T0, and a value in the range from zero to ten and several degrees Celsius (° C.) (for example, 5° C.) is set as the server exhaust heat shift value α. The server exhaust heat shift value α may be set to zero. In this case, it is judged whether the exhaust heat temperature TX1 exceeds the set temperature T0.

When a positive result (yes) is obtained in the judgment of this step S5 (step S5: Yes), that is, when the exhaust heat temperature TX1 exceeds the threshold value (set temperature T0+α), the electronic component unit 51 sets an ON flag of the expansion valve 28A to a predetermined area of the memory (not shown) in the electronic component unit 51 (step S6).

On the other hand, when a negative result (no) is obtained in the judgment of the step S5 (step S5: NO), that is, the exhaust heat temperature TX1 is equal to or less than the threshold value (set temperature T0+α), the electronic component unit 51 sets an OFF flag of the expansion valve 28A to prohibit the cooling of the upper evaporating portion 22 (OFF).

Subsequently, the electronic component unit 51 obtains the exhaust heat temperature TX2 of the lower evaporating portion 23 (step S8), and it is judged whether the exhaust heat temperature TX2 exceeds the threshold value (set temperature T0 of the remote controller 52+server exhaust heat shift value α) (step S9). When a positive result is obtained in the judgment of the step S9 (step S9: YES), that is, the exhaust heat temperature TX2 exceeds the threshold value (set temperature T0+α), the ON flag of the expansion valve 28B is set (step S10). On the other hand, when a negative result is obtained in the judgment of the step S9 (step S9: NO), that is, the exhaust heat temperature TX2 is equal to or less than the threshold value (set temperature T0+α), the electronic component unit 51 sets the OFF flag of the expansion valve 28B (step S11). The flag setting processing described above is repetitively executed under operation, and the flag is rewritten in accordance with the exhaust heat temperatures TX1, TX2.

A controller (not shown) in the electronic component unit 51 properly refers to these flag information. If the ON flag (permission flag) is set, the valve opening control described above is executed for the expansion valve 28A or 28B which corresponds to the ON flag, and cooling is continued by the evaporating portion 22 or 23 which is connected to the expansion valve 28A (or 28B) corresponding to the ON flag. On the other hand, if OFF flag (prohibition flag) is set, the valve of the expansion valve 28A (or 28B) corresponding to the OFF flag is closed, and the cooling of the corresponding evaporating portion 22 (or 23) is prohibited. Therefore, when OFF flag is set to both the expansion valves 28A and 28B, the processing shifts to thermo-OFF to stop the operation of the compressor 32 (32A, 32B).

Therefore, when the exhaust temperature TX1, TX2 is equal to or lower than the set exhaust heat temperature T0 which is defined in the computer room 2 so that no dew condensation occurs in the evaporator 21, the refrigerant supply to the evaporator 21 (the evaporating portion 22, 23) is stopped to avoid dew condensation. When the exhaust heat temperature TX1, TX2 surely exceeds the set exhaust heat temperature T0, the refrigerant supply to the evaporator 21 (the evaporating portion 22, 23) is started, and cool the indoor air with preventing dew condensation.

Figure 14:
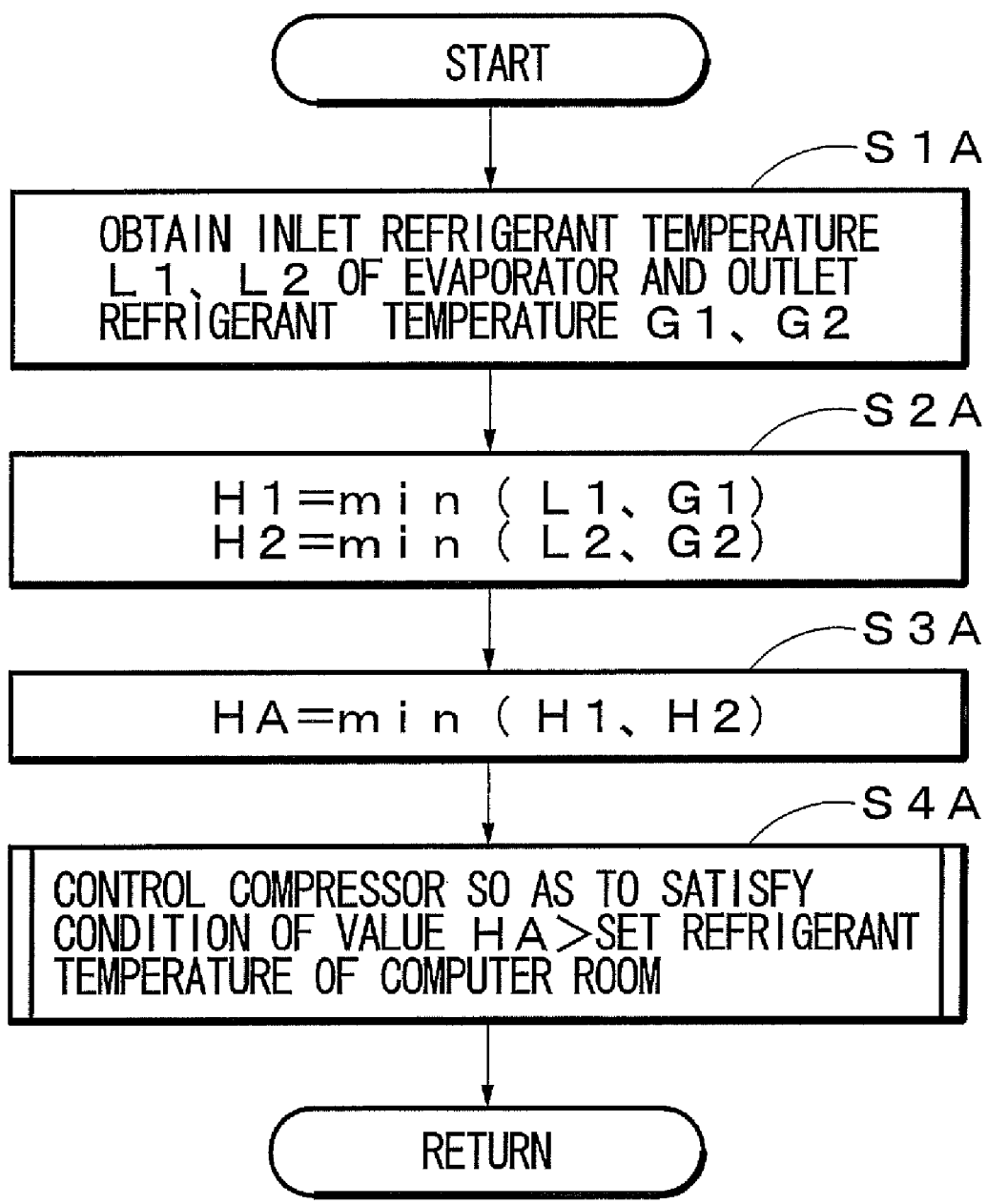
FIG. 14 is a flowchart showing second dew condensation control.

FIG. 14 is a flowchart showing the second dew condensation preventing control.

The electronic component unit (operation controller) 61 of the heat source equipment 30 obtains the refrigerant temperature at the inlet port of the evaporator 21 and the refrigerant temperature at the outlet port of the evaporator 21 to obtain the temperature of refrigerant passing through the evaporator 21 from each electronic device cooling unit 20 (step S1A). In this embodiment, as shown in FIG. 3, the evaporator 21 is constructed by the upper evaporating portion 22 and the lower evaporating portion 23, and thus the refrigerant temperature L1, L2 at the inlet port and the refrigerant temperature G1, G2 at the outlet port of each evaporating portion 22, 23.

Subsequently, in order to specify the minimum value of the refrigerant temperature, the electronic component unit 61 determines a value H1 (=min(L1, G1)) corresponding to the minimum value of the temperatures L1, G1 at the inlet and outlet ports of the upper evaporating portion 22, and also determines a value H2 (=min(L2, G2)) corresponding to the minimum value of the temperatures L1, G1 at the inlet and outlet ports of the lower evaporating portion 23 (step S2A).

Subsequently, the electronic component unit 61 determines a value HA (=min(H1, H2)) corresponding to the minimum value of the values H1, H2 (step S3A), and controls each of the compressors 32A, 32B so that the value HA is not lower than a set refrigerant temperature TH (for example, 18°) which is defined in the computer room 2 so that no dew condensation occurs in the evaporator 21 (step S4A). Here, the lower limit value of the refrigerant temperature which is specified from the humidity condition and the temperature condition of the computer room 2 and at which no dew condensation occurs in the evaporator 21 is applied as the set refrigerant temperature TH.

In this case, with respect to the control of the compressors 32A, 32B, in a case where the value HA approaches to the set refrigerant temperature TH, the following feedback control or the like is executed. That is, when both the compressors 32A and 32B operate, the operation frequency of the power-variable type compressor 32B is lowered. Even in this case, when the value HA is about to dip from the set refrigerant temperature TH, the operation of the compressor 32B or the power-fixed type compressor 32A is stopped. However, when the value HA is about to dip from the set refrigerant temperature TH, the operation of both the compressors 32A and 32B is stopped.

Accordingly, the situation that the temperature of refrigerant passing through the evaporator 21 dips from the set refrigerant temperature TH can be avoided, and thus the dew condensation can be prevented.

Furthermore, in this construction, temperature sensors 29G, 29H (see FIG. 2) are provided in the neighborhood of the front side of the cabinet 11 through which indoor air is sucked to the electronic devices 3. The temperature of sucked air is detected by the temperature sensors 29G and 29H. When the suction air temperature is equal to or less than the set temperature T0 of the remote controller 52, the processing shifts to thermo-OFF to stop the operation of the compressor 32 (32A, 32B). When the temperature is higher than the set temperature T0 of the remote controller 52, the processing returns to thermo-ON. According to this processing, the electronic device cooling apparatus 40 can be prevented from excessively cooling the room, which can also avoid dew condensation of the evaporator 21.

As described above, according to this embodiment, the exhaust heat temperatures TX1, TX2 of the electronic device 3 in the cabinet 11, the refrigerant supply to the evaporator 21 (the evaporating portion 22, 23) is stopped when the exhaust temperatures TX1, TX2 is equal to or less than the set exhaust temperature T0 which is defined in the computer 2 so that no dew condensation occurs in the evaporator 12, and also starts the refrigerant supply to the evaporator 21 (the evaporating portion 22, 23) when the exhaust temperature TX1, TX2 surely exceeds the set exhaust temperature T0. Therefore, the cooling operation can be performed with preventing the dew condensation of the evaporator 21.

In addition, in this construction, the above control is executed on each of the upper evaporating portion 22 and the lower evaporating portion 23 of the evaporator 21. Therefore, the operation of preventing the dew condensation can be controlled independently on each of the upper and lower evaporating portions 22, 23. That is, the refrigerant supply is stopped with respect to only the evaporating portion 22 or 23 which falls into a dew-condition occurring state, and the refrigerant supply can be continued with respect to the other evaporating portion 23 or 22 to thereby continue the cooling operation.

Furthermore, in this embodiment, the temperature of refrigerant passing through the evaporator 21 is detected, and the operation of the compressors 32A, 32B is controlled so that the refrigerant temperature is not lower than the set refrigerant temperature TH which is defined in the computer room so that no dew condensation occurs in the evaporator 21. Therefore, the situation that the refrigerant temperature is excessively lowered and thus dew condensation occurs in the evaporator 21 can be avoided. In addition, in this construction, the lowest refrigerant temperature is detected with respect to each of the upper evaporating portion 22 and the lower evaporating portion 23 of the evaporator 21, and the operation of the compressors 32A and 32B is controlled on the basis of the lowest refrigerant temperature so that the lowest refrigerant temperature is not lower than the set refrigerant temperature TH, so that the dew condensation of each of the evaporating portions 22, 23 can be surely prevented.

Accordingly, in this construction, the dew condensation can be prevented with a more simple construction as compared with an apparatus using a heater or moisture absorbent/discharge material for humidity control.

In the above-described embodiment, the evaporator 21 is divided to the upper evaporating portion 22 and the lower evaporating portion 23, however, the evaporator 21 may not be divided. Furthermore, the evaporator 21 may be divided into three or more, and the dew-condensation preventing control described above may be executed on each evaporating portion.

Furthermore, in the above-described embodiment, a relative humidity sensor and a dry-bulb temperature sensor may be provided in the neighborhood of the front surface of the cabinet 11 through which indoor air is sucked to the electronic devices 3. In this case, a dew-point temperature of the suction air is calculated from the detection temperature, and the operation of the compressors 32A and 32B may be executed so that the temperature of the suction air decreases to the dew-point temperature or less.

According to this embodiment, the electronic device cooling apparatus has the cabinet 11 which are opened at the front and rear surfaces thereof and in which plural electronic devices 3 each having a fan are mounted (for example, may be stacked). The rear door 12 is provided to the rear-side opening 65 of the cabinet 11 so that the cabinet can be ventilated. The evaporator 21, the expansion valves 28A, 28B and the electronic component unit 51 for controlling the expansion valves which constitute the refrigeration cycle are integrally provided in the rear door 12. Therefore, the evaporator 21, the expansion valves 28A, 28B and the electronic component unit 51 can be handled as one electronic device cooling unit 20, and the electronic device cooling unit is connected to the heat source equipment 30 constituting the refrigeration cycle, whereby heat radiated from the electronic devices 3 can be cooled simply.

Furthermore, refrigerant circulating in the refrigeration cycle is supplied to the evaporator 21 disposed in the rear door 12. Therefore, even when the refrigerant leaks from the refrigerant t circulating passage, the electronic device 3 can be prevented from being damaged by this refrigerant due to short-circuiting or ground leakage. Furthermore, air blown by the fan 4 can be cooled by the evaporator 21 of the rear door 12 and then returned to the room. Therefore, the room temperature can be prevented from excessively increasing due to heat radiated from the electronic devices 3, or occurrence of a temperature distribution in the room can be prevented. Accordingly, according to this embodiment, the electronic devices 3 can be effectively cooled without using water.

When the evaporator 21 is divided into plural evaporating portions (for example, the evaporating portions 22, 23), the evaporator 21 can be designed so that refrigerant is made to selectively flow through each of the evaporating portions 22, 23. Therefore, the amount of refrigerant flowing through the evaporating portion 22 corresponding to an area having a large thermal load can be set to a large value while the amount of refrigerant flowing through the evaporating portion 23 corresponding to an area having a small thermal load is set to a small value, whereby the electronic devices 3 stacked and mounted in the cabinet 11 can be effectively cooled. Furthermore, by making the refrigerant selectively flow through each evaporating portion 22, for example, the amount of the refrigerant flowing through the evaporating portion 23 corresponding to an area having a small thermal load can be set to a small value. Therefore, the overall refrigerant circulation amount of the evaporator 21 can be reduced, and thus the energy consumption can be also reduced. Furthermore, the air blown by the fan 4 is cooled by the evaporator 21 of the rear door 12 and then returned to the room, so that the room temperature can be prevented from excessively increasing due to heat radiated from the electronic deices 3.

Furthermore, according to this embodiment, the evaporator 21 is disposed in the whole area of the outdoor unit 21, the liquid pipe 27 (or the liquid branch pipes 27A, 27B) and the gas pipe 29 connected to the evaporator 21 (or the evaporating portions 22, 23) and the expansion valves 28A, 28B provided to the liquid pipe 27 (or the liquid branch pipes 27A, 27B) are collectively disposed at the hinge 66 side of the rear door 12, and the electronic component unit 51 is disposed in the lower area of the rear door 12. Therefore, the expansion valves 28A, 28B and the electronic component unit 51 can be collectively disposed in the rear door 12. Furthermore, the electronic component unit 51 is disposed in the lower area of the rear door 12, that is, below the evaporator 21, and thus a part of air cooled by the evaporator 21 flows downwardly to cool the electronic component unit 51. Therefore, it is unnecessary to separately provide any equipment for cooling the electronic component unit 51, and the construction of the electronic component unit 51 can be simplified.

The caster 13 is secured to the bottom portion of the cabinet 11 so that the cabinet 11 is freely movable. For example, even when the layout of the cabinets 11 in the computer room 2 is changed, this changing work can be easily performed.

Furthermore, when the evaporating portions 22 and 23 are divisionally mounted at the upper and lower sides, the refrigerant amount flowing in each of the evaporating portions 22 and 23 can be simply adjusted in accordance with the exhaust heat of the electronic devices 3 disposed at the upper and lower sides of the cabinet 11. Therefore, the opening degrees of the expansion valves 28A and 28B are changed between an area having a large thermal load and an area having a small thermal load, whereby the cooling operation can be properly executed in accordance with each area. In this case, according to this embodiment, the evaporating portions 22 and 23 are divided into the evaporating portions 22 and 23 at the upper and lower sides with respect to the partition plate 11E provided to the cabinet 11 in advance. Therefore, the amount of refrigerant flowing in each of the evaporating portions 22 and 23 can be simply adjusted in accordance with the exhaust heat of the electronic devices 3 disposed in each area compartmented by the partition plate 11E. Accordingly, by changing the opening degrees of the expansion valves 28A and 28B between the area having a large thermal load and the area having a small thermal load (or which does not have a large thermal load), the cooling operation suitable for each area can be performed. Furthermore, the respective areas are compartmented by the partition plate 11E, and thus air discharged from the electronic devices 3 disposed in an area is not mixed with air discharged from the electronic devices 3 disposed in another area in the cabinet 11, so that the electronic devices 3 disposed in each area can be effectively cooled.

Furthermore, according to this embodiment, the evaporator 21 constituting the refrigeration cycle is provided to the rear door 12, and the small-diameter flexible liquid pipe 25 and the large-diameter flexible gas pipe 26 which are connected to the evaporator 21 are collectively disposed at the hinge 66 side so that the flexible gas pipe 26 is nearer to the hinge 66 side of the rear door 12 than the flexible liquid pipe 25. Therefore, the slack amount of the large-diameter flexible gas pipe 26 can be suppressed to a small value when the rear door 12 is opened/closed, and thus the rear door 12 can be smoothly opened/closed with small force.

Furthermore, the main liquid pipe 31A and the main gas pipe 31B are disposed in the underfloor space of the double flooring, and the flexible liquid pipe 25 and the flexible gas pipe 26 connected to the main liquid pipe 31A and the main gas pipe 31B are passed through the opening hole 2C formed in the upper floor 2A and connected to the evaporator 21 disposed in the rear door 12. Accordingly, the main liquid pipe 31A, the main gas pipe 31B, the flexible liquid pipe 25 and the flexible gas pipe 26 do not exist on the upper floor 2A, and thus they do not disturb a worker or the like who moves in the computer room 2.

Still furthermore, the liquid pipe 27 and the gas pipe 29 connected to the evaporator 21 are collectively disposed at the hinge 66 side of the rear door 12, and the drain pan 77 for receiving drain water dropping from the evaporator 21 to the lower side of the evaporator 21 is provided. Therefore, the drain water can be prevented from adversely affecting the electronic component unit 51 and the electronic devices 3 mounted in the cabinet 11. Furthermore, the drain pan 77 is provided with the extension portion 77B extending to the hinge 66 side of the rear door 12, and the extension portion 77B is provided with the liquid pipe penetrating portion 78 and the gas pipe penetrating hole portion 79 through which the liquid pipe 27 and the gas pipe 29 penetrate and the hose connection port 81 to which the drain hose 80 for discharging drain water stocked in the drain pan 77 to the outside of the apparatus is connected. Therefore, the evaporator 21, the liquid pipe 27, the gas pipe 29, the drain pan 77 and the drain hose 80 can be collectively disposed. The drain pan 77 has the cut-out portion 84 obtained by cutting out a part of t wall surface of the extension portion 77 so that the cut-out portion 77 is lower than the other portion of the wall surface. Therefore, even if there occurs such a situation that water overflows from the drain pan 77 because t drain hose 80 is clogged or the like, the drain water overflows through the cut-out portion 84. Therefore, the overflowing water passes along the liquid pipe 27, the gas pipe 29, the drain hose 80, etc. and flows to the opening hole 2C formed in the upper floor 2A. Therefore, the drain water can be prevented from dropping to the electronic component unit 51 and the electronic devices 3 mounted in the cabinet 11.

The present invention is not limited to the above-described embodiments. For example, in the above embodiments, the evaporator 21 is divided to the upper evaporating portion 22 and the lower evaporating portion 23. However, the evaporator 21 is not required to be divided, and it may be divided to evaporating portions whose number is equal to three or more. Specifically, when the partition plate 11E in the cabinet 11 is constructed by two stages (shelves), the evaporator is divided to three evaporating portions in the vertical direction, and these evaporating portions are separated (compartmented) by the partition plate 11E of the two stages. When the partition plate 11E in the cabinet 11 is constructed by five stages (shelves), the evaporator 21 is divided to six evaporating portions in the vertical direction, the expansion valve is connected to each of these six evaporating portions, and the refrigerant flow control corresponding the number of the stages of the partition plate 11E is carried out.

Furthermore, in the above-described embodiments, each of the upper evaporating portion 22 and the lower evaporating portion 23 may be further divided to plural evaporating portions, and an expansion valve may be connected to each of these evaporating portions. According to this construction, the refrigerant flow control can be more finely controlled in conformity with the actuation state of the electronic devices 3 mounted in the cabinet 11, and thus the energy consumption in the heat source equipment 30 can be reduced.

Furthermore, in the above embodiments, the electronic device 3 mounted in the cabinet 11 is designed to be horizontally long. Therefore, the partition plate 11E is horizontally disposed, and the inside of the cabinet 11 is divided to the upper and lower sides in the vertical direction. However, when vertically long electronic devices (not shown) are mounted in the cabinet, the partition plate may be vertically disposed so that the inside of the cabinet is divided to the right and left sides. In this case, it is desired that the evaporator is divided to evaporating portions at the right and left sides by the partition plate which is vertically disposed.

Figure 15:
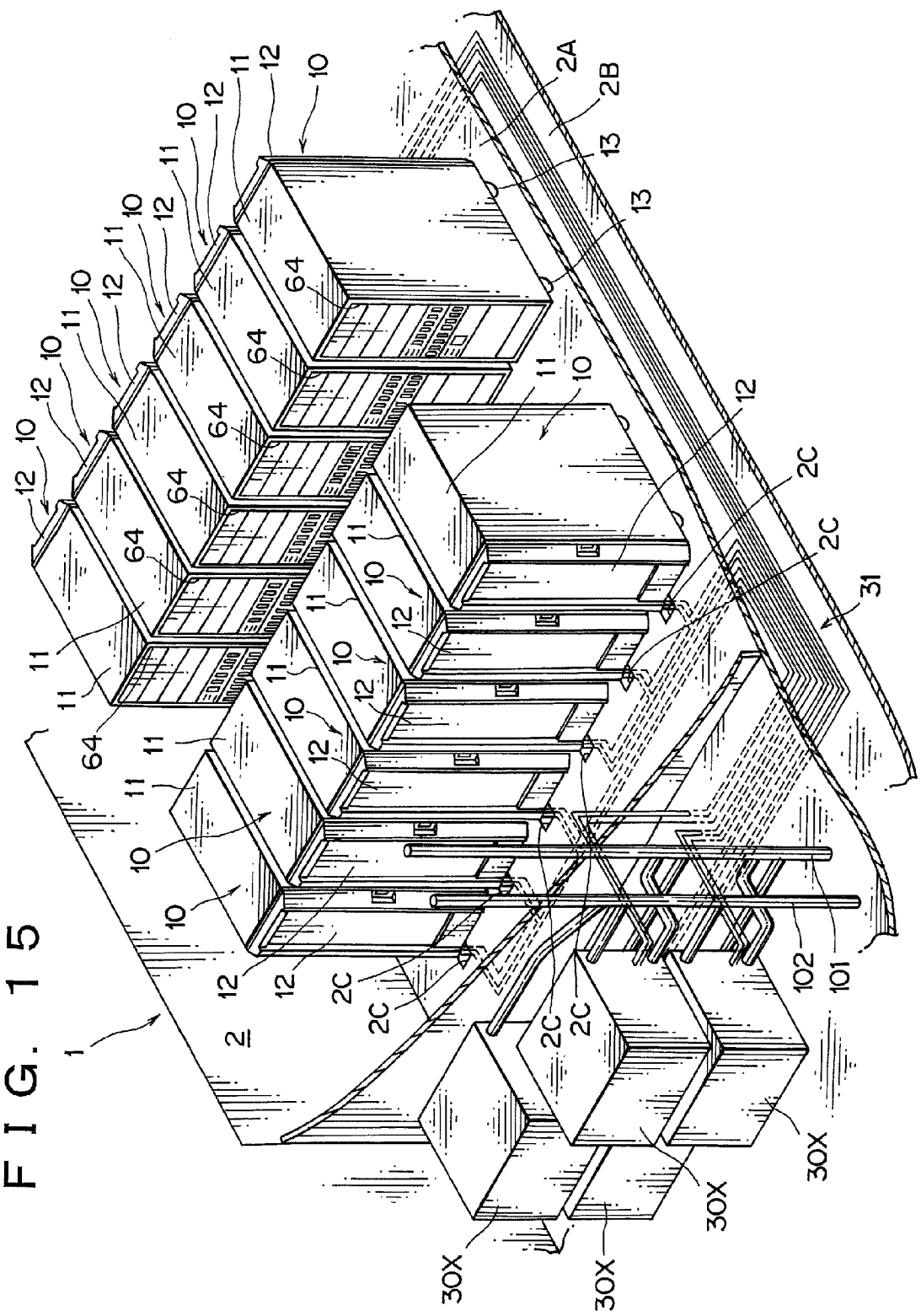
FIG. 15 is a diagram showing an electronic device cooling system using a water cooling type heat source equipment.

Still furthermore, in the above embodiments, the present invention is applied to the electronic device cooling apparatus 40 having the two compressors 32A, 32B. However, the present invention may be applied to the electronic device cooling apparatus having one compressor or three or more compressors. Furthermore, in the above embodiments, the air cooling type heat source equipment 30 is used. However, a water cooling type heat source equipment 30X as shown in FIG. 15 may be used. When the water cooling type heat source equipment 30X is sued, the heat source equipment 30X is connected to water pipes 101 and 102 extending from a cooling shower (not shown). Therefore, plural heat source equipment 30X can be arranged while superposed on one another, and thus the arrangement space of the heat source equipment 30X can be reduced. An air conditioner may be connected to the main refrigerant pipe 31 extending from the heat source equipment 30,30X to perform air-conditioning of the computer room by the air conditioner.

The heat source equipment 30, 30X may be constructed as a specialized machine for cooling (refrigerating) cycle having no four-way valve 34. Furthermore, the compressor 32 provided to the heat source equipment 30, 30X is driven by an electric motor, that is, it is of so-called EHP (Electrical Heat Pump) type. However, the present invention is not limited to this type of compressor. The compressor 32 may be GHP (Gas Heat Pump) type heat source equipment in which the compressor is driven by driving of a gas engine.

As described above, the present invention is not limited to the construction that the partition plates for partitioning the inside of the cabinet 11 are arranged to be spaced from one another at predetermined intervals in the vertical direction, but it may adopt the construction that the partition plates are vertically arranged so as to be spaced from one another at predetermined intervals in the right and left direction (horizontal direction) and the electronic devices 3 are arranged to be vertical long. In this case, the evaporator is divided into plural evaporating portions at the upper and lower sides or at the right and left sides with the partition plates as the boundaries, an expansion valve is provided to each evaporating portion, and in accordance with heat radiation of the electronic devices of each stage, each expansion valve is individually controlled so as to cool the heat radiation amount concerned. Alternatively, plural evaporating portions are provided at the upper and lower sides or at the right and left sides at each stage, an expansion valve is provided to each evaporating portion and each expansion valve is individually controlled so as to cool a heat radiation amount which is different every area even at the same stage.

As described above, the present invention may be applied to an electronic device cooling system in which an air conditioner is connected to the main refrigerant pipe 31 extending from the heat source equipment 30, 30X and the computer room 2 is air-conditioned by this air conditioner. In this case, when air conditioners are newly added, the connection ports for expansion can be used, and thus the additional provision of the air conditioners can be easily performed.

Furthermore, in the above-described embodiments, the rear door 12 of the server rack 10 is a single swing door. However, the rear door 12 may be a double swing door. According to this construction, even when the width of the cabinet is larger as the lateral width of the electronic device is larger, the movable range of the door in the double swing door can be set to be smaller as compared with the single swing door, and thus the maintenance work can be easily performed.

What is claimed is:
1. An electronic device cooling system comprising:
at least one cabinet that is opened at the front and rear sides thereof and in which a plurality of electronic devices each having a fan are mounted;
a rear door disposed at a rear opening side of the cabinet so that air can flow through the rear door;
an evaporator that constitutes a refrigeration cycle and is provided to the rear door, wherein air blown by the fan is cooled by the evaporator of the rear door and returned to a room, wherein refrigerant pipes connected to the evaporator are collectively disposed at a hinge side, a drain pan for receiving drain water dropped from the evaporator is provided below the evaporator, the drain pan is provided with an extension portion extending to the hinge side of the rear door and the extension portion is provided with a hole portion through which the refrigerant pipes penetrate and a drain hose connection port to which a drain hose for discharging drain water stocked in the drain pan to the outside of the apparatus is connected.

2. The electronic device cooling system according to claim 1, wherein the rear door is provided with an expansion valve constituting the refrigerant cycle and an electronic component box for controlling the expansion valve integrally with the evaporator.

3. The electronic device cooling system according to claim 1, wherein the evaporator is disposed substantially over the whole area of the rear door, a refrigerant pipe connected to the evaporator and the expansion valve are collectively disposed at a hinge side of the rear door, and the electronic component box is disposed in a lower area of the rear door.

4. The electronic device cooling system according to claim 1, wherein a caster is provided to the bottom portion of the cabinet so that the cabinet is freely movable.

5. The electronic device cooling system according to claim 1, wherein the evaporator is divided to plural evaporating portions so that refrigerant is made to selectively flow through each of the evaporating portions.

6. The electronic device cooling system according to claim 5, wherein the evaporator is disposed substantially over the whole area of the rear door, a refrigerant pipe connected to each evaporating portion of the evaporator and expansion valves provided to the plural evaporating portions are collectively disposed at a hinge side of the rear door, and an electronic component box for controlling the expansion valves is disposed in a lower area of the rear door.

7. The electronic device cooling system according to claim 5, wherein the evaporating portion is further divided into two parts in the vertical direction.

8. The electronic device cooling system according to claim 5, wherein the evaporating portion is divided into the two parts with a shelf portion provided to the cabinet in advance as a boundary therebetween.

9. The electronic device cooling system according to claim 8, wherein each of the two parts into which the evaporating portion is divided with respect to the shelf portion may be further divided into plural parts.

10. The electronic device cooling system according to claim 1, wherein a liquid pipe having a smaller diameter and a gas pipe having a larger diameter which are connected to the evaporator are collectively disposed at a hinge side of the rear door so that the gas pipe is nearer to the hinge side than the liquid pipe.

11. The electronic device cooling system according to claim 10, the liquid pipe and the gas pipe are a flexible liquid pipe and a flexible gas pipe which are connected to a main liquid pipe and a main gas pipe extending from heat source equipment having a compressor and a condenser, respectively.

12. The electronic device cooling system according to claim 11, wherein the cabinet is disposed on a double flooring having a lower floor and an upper floor which has an opening therein and disposed above a lower floor so that a space is provided between the upper and lower floors, the main liquid pipe and the main gas pipe are disposed in the space, and the flexile liquid pipe and the flexible gas pipe which are connected to the main liquid pipe and the main gas pipe respectively are connected through the opening of the upper floor to the evaporator disposed in the rear door of the cabinet.

13. The electronic device cooling system according to claim 1, wherein the drain pan is provided with a cut-out portion which is formed by cutting out a part of the upper edge of the extension portions so that the cut-out portion is lower than the other portion of the upper edge.

* * * * *